(12) United States Patent
Liu et al.

(10) Patent No.: US 10,566,577 B2
(45) Date of Patent: Feb. 18, 2020

(54) ORGANIC LIGHT EMITTING DISPLAY DEVICE AND ORGANIC LIGHT EMITTING DISPLAY APPARATUS

(71) Applicants: Shanghai Tianma AM-OLED Co., Ltd., Shanghai (CN); TIANMA MICRO-ELECTRONICS CO., LTD., Shenzhen (CN)

(72) Inventors: Yinhe Liu, Shanghai (CN); Wei He, Shanghai (CN); Xiangcheng Wang, Shanghai (CN); Yuji Hamada, Shanghai (CN); Jinghua Niu, Shanghai (CN); Qing Zhu, Shanghai (CN)

(73) Assignees: Shanghai Tianma AM-OLED Co., Ltd., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 33 days.

(21) Appl. No.: 15/616,944

(22) Filed: Jun. 8, 2017

(65) Prior Publication Data
US 2018/0190940 A1  Jul. 5, 2018

(30) Foreign Application Priority Data
Dec. 30, 2016 (CN) .......................... 2016 1 1255316

(51) Int. Cl.
H01L 51/52 (2006.01)
H01L 51/50 (2006.01)

(52) U.S. Cl.
CPC ...... H01L 51/5275 (2013.01); H01L 51/5253 (2013.01); H01L 2251/5315 (2013.01)

(58) Field of Classification Search
None
See application file for complete search history.

(56) References Cited

U.S. PATENT DOCUMENTS

| 9,136,503 B2* | 9/2015 | Song | H01L 51/5253 |
| 2012/0112628 A1* | 5/2012 | Yoon | H01L 51/5231 313/504 |
| 2014/0091284 A1* | 4/2014 | Feng | H01L 51/5203 257/40 |
| 2016/0133880 A1* | 5/2016 | Lee | H01L 51/5281 257/40 |

(Continued)

FOREIGN PATENT DOCUMENTS

CN 102290531 A 12/2011

*Primary Examiner* — Walter H Swanson
*Assistant Examiner* — Kien C Ly
(74) *Attorney, Agent, or Firm* — Kilpatrick Townsend & Stockton, LLP

(57) ABSTRACT

An organic light emitting display device and an organic light emitting display apparatus are provided. The organic light emitting display device includes a first electrode and a second electrode disposed opposite to each other, a light emitting layer positioned between the first electrode and the second electrode, and a capping layer positioned on a surface of a side of the second electrode far away from the light emitting layer, the capping layer is formed as a single layer or superposition of a plurality of layers, the at least one layer of the capping layer is a composite layer, and the composite material of the composite layer comprises an organic material and a metal dopant.

13 Claims, 27 Drawing Sheets

(56) References Cited

U.S. PATENT DOCUMENTS

2016/0190518 A1* 6/2016 Wang .................. H01L 51/5268
                                                              257/40
2016/0240589 A1* 8/2016 Jeong .................... H01L 27/322
2017/0108971 A1* 4/2017 Yang ....................... G06F 1/163

* cited by examiner

US 10,566,577 B2

ORGANIC LIGHT EMITTING DISPLAY DEVICE AND ORGANIC LIGHT EMITTING DISPLAY APPARATUS

CROSS-REFERENCE TO RELATED APPLICATIONS

This application claims priority to Chinese patent application No. 201611255316.0 filed on Dec. 30, 2016 and titled "Organic Light Emitting Display Device and Organic Light Emitting Display Apparatus", which is incorporated herein by reference in its entirety.

TECHNICAL FIELD

Embodiments of the present disclosure relate to the field of a display, and more particularly to an organic light emitting display device and an organic light emitting display apparatus.

BACKGROUND

An organic light emitting display (OLED) device is a thin film light emitting device made of a organic light emitting material and driven by direct current voltage, which has the characteristics of lightness, greater angles of view and power saving. With the commercialized application and development of the display device, the commercialized products to the requirements of a pixel accuracy and a light extraction efficiency of the OLED device are becoming higher and higher. In order to improve the light extraction efficiency, the existing OLED devices usually utilize a top-emitting mode.

A top-emitting OLED device of the prior art is illustrated in FIG. 1. The OLED device includes a substrate 10, an anode 11, a hole transport layer 12, a light emitting layer 13, an electron transport layer 14, a cathode 15 and a capping layer 16, and the light is emitted from the top of the device. The cathode 15 of the top-emitting OLED device typically is made of a thin semi-permeable metal conductive material and the anode 11 uses a totally reflective anode, and meanwhile the capping layer 16 for the light output coupling is provided on the cathode 15 to improve the light extraction efficiency.

The existing capping layer is made of an organic materials or an inorganic materials. If the capping layer is made of the inorganic material such as LiF, there exist the problems of lower refractive index and poor light extraction efficiency. If the capping layer is made of the organic material such as 8-hydroxyxyquinoline aluminum salt (ALQ3), color cast in the angle of view of the light is more serious, although it has a higher refractive index and a higher light extraction efficiency.

SUMMARY

Embodiments can provide an organic light emitting display device and an organic light emitting display apparatus to solve the problems that the poor light extraction efficiency or the serious color cast of the existing organic light emitting display device.

In a first aspect, an embodiment provides an organic light emitting display device, which includes:
a first electrode and a second electrode disposed opposite to each other, a light emitting layer positioned between the first electrode and the second electrode,
a capping layer positioned on a surface of a side of the second electrode far away from the light emitting layer, the capping layer is formed as a single layer or superposition of multiple layers, at least one layer of the capping layer is a composite layer, and the material of the composite layer includes an organic material and a metal dopant.

In a second aspect, the embodiment further provides an organic light emitting display apparatus which includes the organic light emitting display device as described above.

According to the organic light emitting display device provided by the embodiment, the capping layer includes at least one composite layer, and the material of the composite layer includes an organic material and a metal dopant. In the embodiment, the composite layer contains the organic material, so the capping layer has a higher refractive index and a higher light extraction efficiency. The composite layer further contains the metal dopant, and the metal dopant itself has good reflection and refraction characteristics. The doping of the organic material does not lead to a significant reduction in the refractive index of the capping layer, so as not to affect the light extraction efficiency of the capping layer, thereby ensuring the high refractive index and light extraction efficiency of the capping layer. In the embodiment, after the light emitted from the light emitting layer enters the capping layer, and the metal dopant in the capping layer reflects and refracts the light so that the portion of the light is changed in the propagation direction and is scattered in different directions. Therefore, when the viewer observes the organic light emitting display device from various angles, whatever the scattered light can be seen, thus the color cast phenomenon is reduced.

BRIEF DESCRIPTION OF DRAWINGS

In order to more clearly illustrate the embodiments of the present disclosure or the technical solutions in the prior art, the accompanying drawings, which are intended to be used in the description of the embodiments or the prior art, are briefly described as below, and it will be apparent that the drawings in the following descriptions are some embodiments of the present disclosure, and other drawings may be obtained by those skilled in the art according to these drawings without paying any inventive work.

DETAILED DESCRIPTION

The technical solution of the present disclosure will now be clearly described by way of embodiments thoroughly, with reference to the accompanying drawings of the embodiments of the present disclosure, in order to make the objects, technical solutions and the advantages of the present disclosure clearer. It is apparent that the embodiments described are a portion of the embodiments of the present disclosure, but not all of the embodiments. All other embodiments obtained by those of ordinary skill in the art without making any creative work fall into the scope of the present disclosure, based on the embodiments of the present disclosure.

Figure 1:
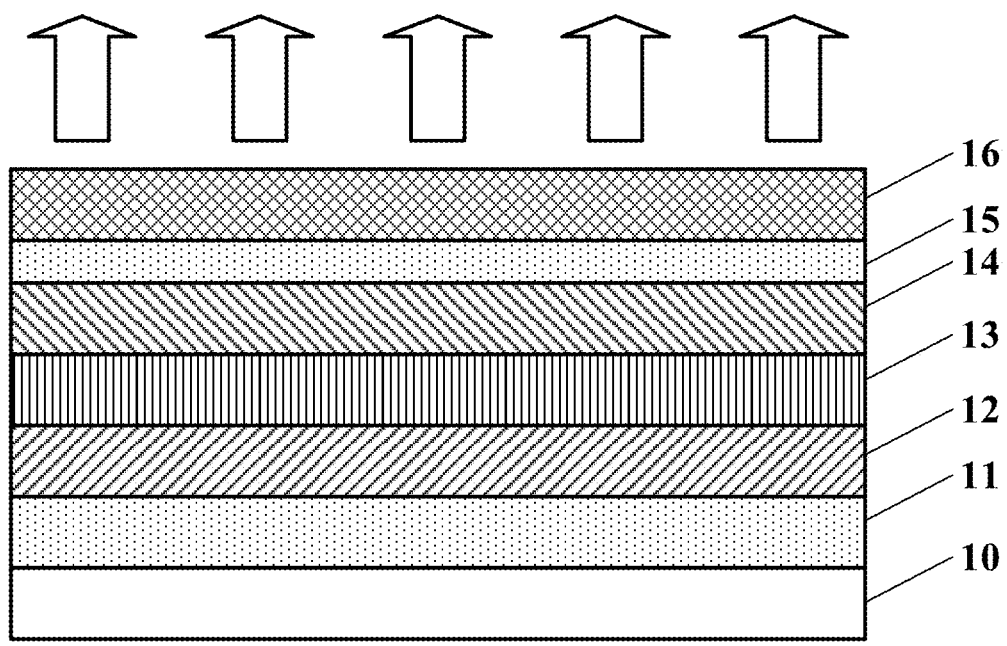
FIG. 1 is a schematic diagram of a top-emitting OLED device according to the prior art.

FIG. 1 is a schematic view of a top-emitting OLED device according to the prior art. The top-emitting OLED device as shown in FIG. 1, in order to increase the transmittance of light, has a cathode made of a thin semi-permeable metal conductive material, thus the cathode is thinner such that its resistance is very high. Especially for larger size OLED devices, the resistance of the cathode of OLED device is high, which leads to a greater voltage drop in the cathode, and which makes the display brightness uneven, and thus it is prone to lead to damage of the OLED device.

In order to improve the problem of uneven display brightness of the organic light emitting display device, other organic light emitting display device is provided in the prior art. The organic light emitting display device has an auxiliary electrode that is composed of a metal having a relatively low resistivity. The auxiliary electrode is thick and a value of square resistance thereof is about 1Ω, and the auxiliary electrode is electrically connected to the cathode. After the voltage is applied to the cathode and the anode, the voltage drop passing through the cathode is small due to the electrical connection between the cathode and the auxiliary electrode, thereby improving the unevenness the display brightness of the device.

Since the auxiliary electrode is made of an opaque metal conductive material, the voltage drop can be effectively reduced. However, the light of the organic light emitting display device is blocked, so that the auxiliary electrode cannot be disposed directly above the light emitting layer. In the present embodiment, two kinds of organic light emitting display devices are provided, and their auxiliary electrodes are located at different positions of the device.

Figure 2A:
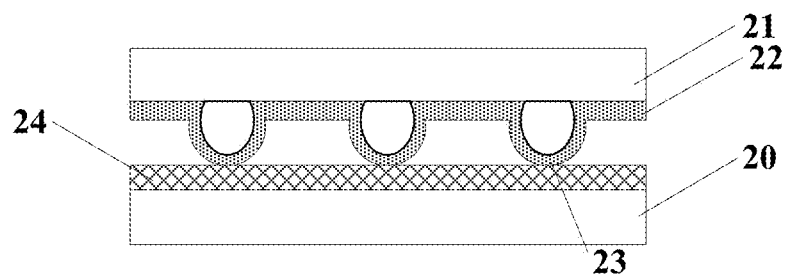
FIGS. 2A to 2B are schematic views of two kinds of top-emitting OLED devices according to the prior art.
Figure 2B:
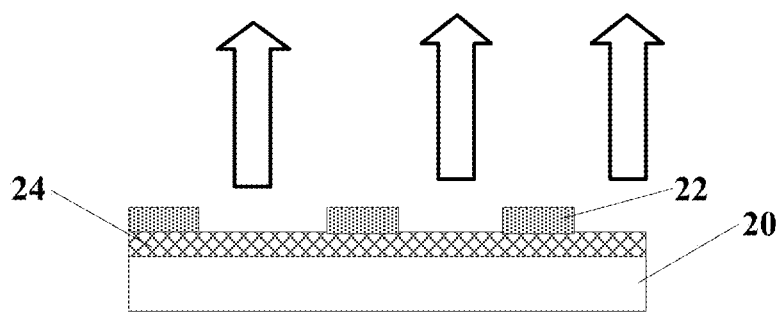

FIGS. 2A to 2B are schematic views of two kinds of top-emitting OLED devices according to the prior art. As shown in FIG. 2A, the organic light emitting display device includes an organic light emitting display substrate 20, an upper substrate 21 and an auxiliary electrode 22 which are stacked in turn. The upper substrate 21 may be a color film substrate or a thin film encapsulation layer. The upper substrate 21 and the organic light emitting display substrate 20 are pressed together under vacuum, the auxiliary electrode 22 is positioned on the upper substrate 21, and the auxiliary electrode 22 is in contact with the cathode 24 and produces a deformation under the pressure of a spacer 23. However, the solution has the following two problems: (i) a deformation of the spacer 23 may cause the auxiliary electrode 22 to break, and there is a risk that the auxiliary electrode 22 and the cathode 24 are short-circuit connected, so the pressing force must be precisely controlled; and (ii) since the contact between the auxiliary electrode 22 above the spacer 23 and the cathode 24 is surface contact, there is a risk of a poor contact.

As illustrated in FIG. 2B, the organic light emitting display device includes the organic light emitting display substrate 20 and the auxiliary electrode 22 stacked in turn, and the auxiliary electrode 22 of the organic light emitting display device is located in a non-light emitting region of the cathode 24. However, the solution has the following two problems: (i) the requirements for the positioning accuracy of the auxiliary electrode 22 can be easily achieved by the existing exposure process, but the OLED device is very sensitive to moisture and water vapor and can not be compatible with the etching process of a thin film transistor (TFT); and (ii) the thin cathode metal is prone to be over-etched.

Figure 3:
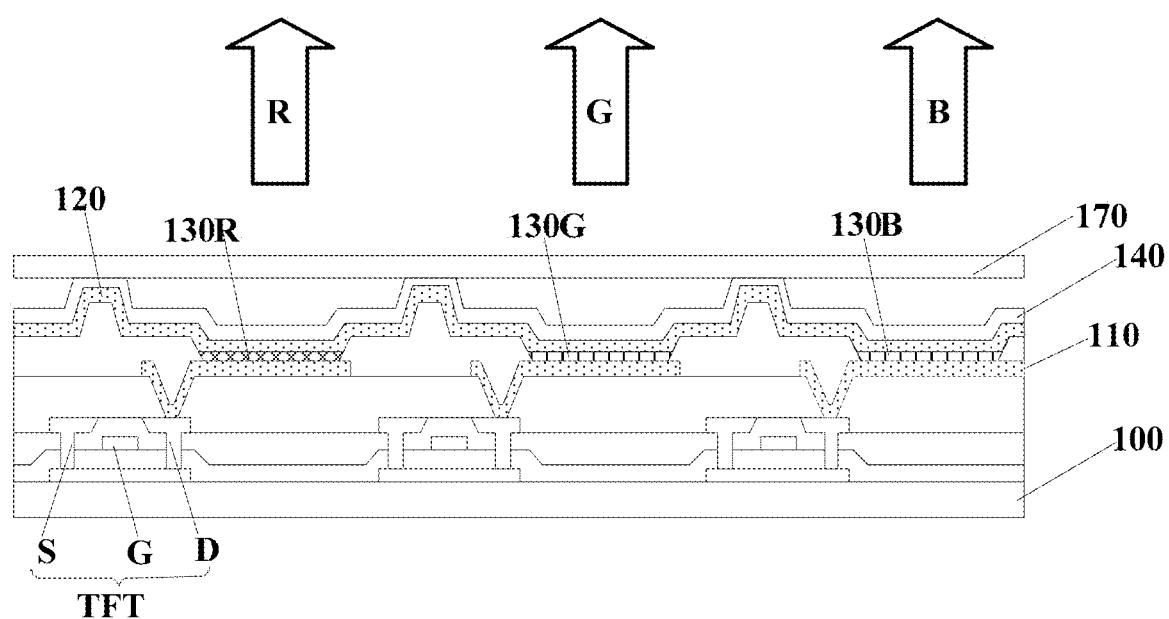
FIG. 3 is a schematic view of an organic light emitting display device according to an embodiment.

FIG. 3 illustrates a schematic diagram of an organic light emitting display device according to an embodiment. The organic light emitting display device includes a lower substrate 100 and an upper substrate 170, a TFT array, an anode 110, a light emitting layer 130G corresponding to an R pixel region, the light emitting layer 130R corresponding to a G pixel region, the light emitting layer 130B corresponding to a B pixel region, a cathode 120 and a capping layer 140, which are located between the lower substrate 100 and the upper substrate 170. A microcavity structure is formed between the anode 110 and the cathode 120 in the organic light emitting display device. Taking emitting red light as an example, the luminous mechanism of the organic light emitting display device is to apply a positive voltage to the anode 110 corresponding to the R pixel region and a negative voltage to the cathode 120, and the holes generated by the anode 110 are injected into the corresponding light emission layer 130R, the electrons generated by the cathode 120 are also injected into the corresponding light emitting layer 130R; the electrons and holes that are injected into the light emitting layer 130R are recombined to generate excitons, and radiation transition of the excitons causes the light emitting layer 130R to emit the red light.

Figure 4A:
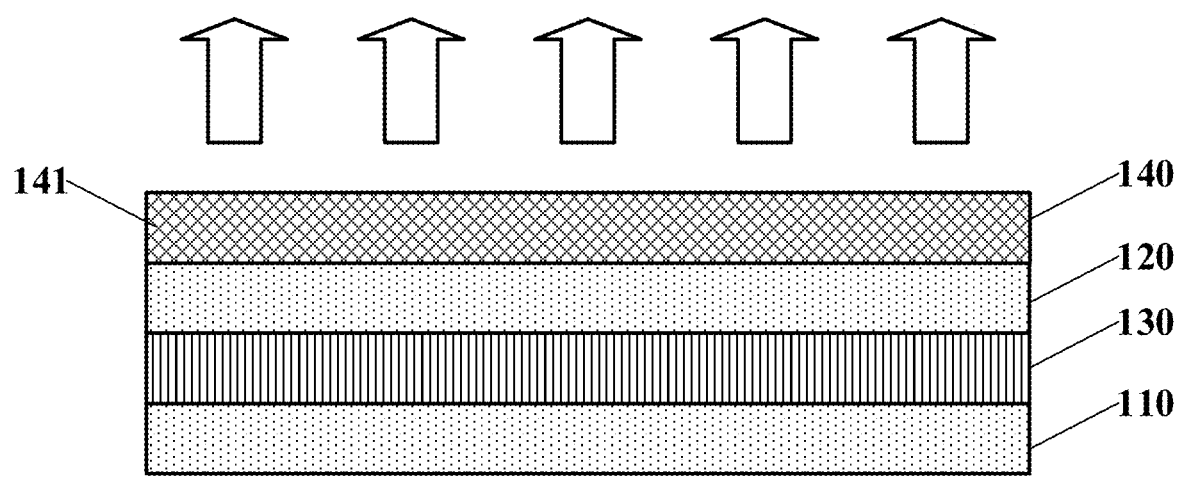
FIGS. 4A to 4F are schematic views of various local structures of the organic light emitting display device of FIG. 3.
Figure 4B:
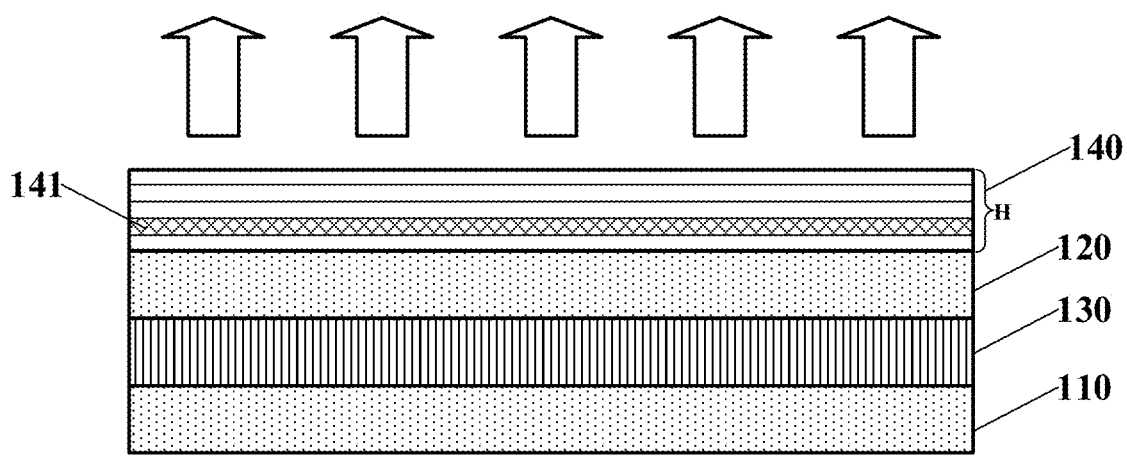
Figure 4C:
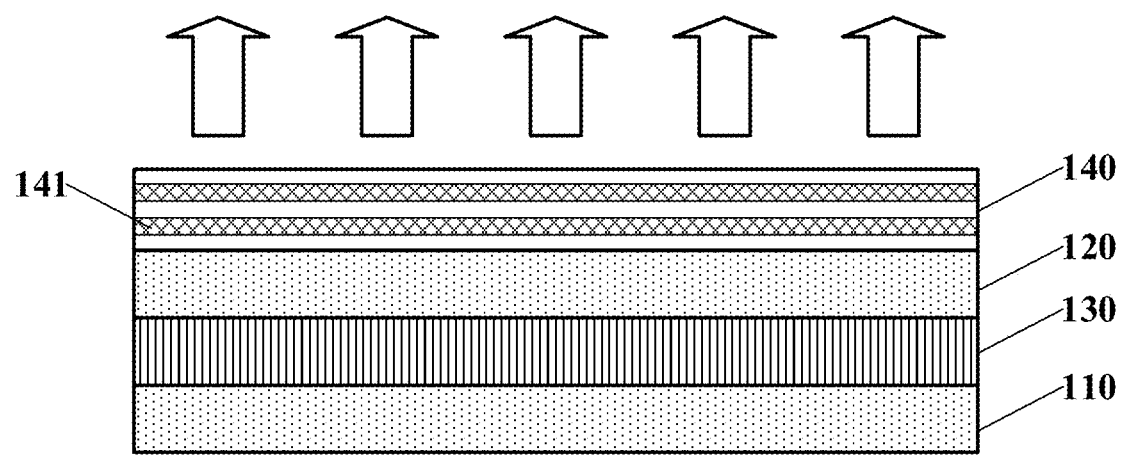

In order to clearly describe the technical solution of the present disclosure, only the partial structure of the organic light emitting display device is described and illustrated in the following embodiments as an example. As shown in FIGS. 4A to 4C, which are schematic views showing various partial structures of the organic light emitting display device of FIG. 3, and the organic light emitting display device according to the present embodiment includes a first electrode 110 and a second electrode 120 that are disposed opposite to each other, a light emitting layer 130 positioned between the first electrode 110 and the second electrode 120, and a capping layer 140 located on a surface of a side of the second electrode 120 facing away from the light emitting layer 130. The capping layer 140 is formed as a single layer or superposition of a plurality of layers, and at least one layer of the capping layer 140 is a composite layer 141. The material of the composite layer 141 contains an organic material and a metal dopant. FIG. 4A shows that the capping layer 140 is a monolayer film structure and the monolayer film is the composite layer 141, FIG. 4B shows that the capping layer 140 is a superposed multilayer film structure in which one layer is the composite layer 141, and FIG. 4C shows that the capping layer 140 is a superposed multilayer film structure in which at least two layers are the composite layer 141.

In the present embodiment, the optional organic light emitting display device is a top-emitting display device, and the light is emitted from a side of the second electrode 120. The first electrode 110 and the second electrode 120 constitute a microcavity structure of the organic light emitting display device, and the microcavity structure has a microcavity effect that is capable of increasing the light extraction efficiency of the organic light emitting display device. The organic light emitting display device includes the capping layer 140 which can be used to adjust the length of the microcavity and then affect the microcavity effect. Specifically, the capping layer 140 is actually formed on a surface of a side of the cathode 120 facing away from the lower substrate 100 in the organic light emitting display device shown in FIG. 3.

For the sake of convenience of description, a description of the structure of the capping layer will be given with reference to FIGS. 4A to 4C of the present embodiment. In the present embodiment, the capping layer 140 includes at least one composite layer 141, the material of the composite layer 141 includes an organic material and a metal dopant. The organic material may be any known organic material applied to the capping layer 140, for example, aromatic organic materials. The composite layer 141 of the capping layer 140 contains the organic material. When the composite layer 141 is made of the organic material, the capping layer 140 has a higher refractive index and a higher light extraction efficiency, and the metal dopant itself has good reflection and refraction characteristics, so when the metal dopant is doped into the organic material, the refractive index of the capping layer 140 cannot be caused to significantly reduction so as not to affect the light extraction efficiency of the capping layer 140, thereby ensuring the higher refractive index and the higher light extraction efficiency of the capping layer 140, and ensuring that the capping layer 140 has the transmittance of more than 90%. As the metal dopant is doped into the composite layer 141, after the light emitted from the light emitting layer 130 enters the capping layer 140, the metal dopant in the capping layer 140 can reflect and refract the light to cause the portion of the light is changed in propagation direction and is scattered in a different directions, so the light emitted from the organic light emitting display device is scattered toward a plurality of directions. Correspondingly, the observer can see the scattered light when viewing the organic light emitting display device from various angles, thereby reducing the color cast phenomenon. The capping layer 140 in the present embodiment protects the second electrode 120 and the light emitting layer 130 from degradation due to external moisture or oxygen, and improves the color cast phenomenon of the organic light emitting display device on the basis of ensuring high refractive index and light extraction efficiency.

Figure 4D:
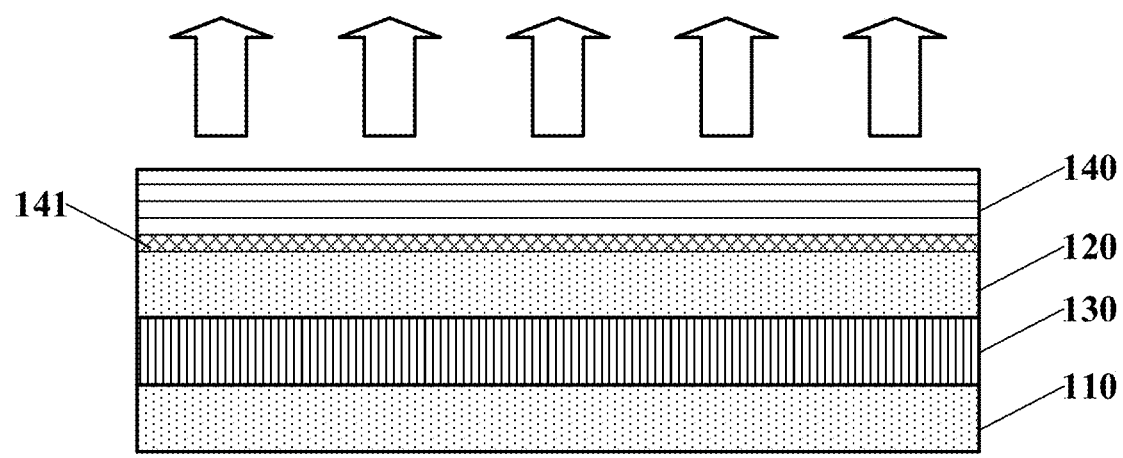

An organic light emitting display device having a partial film structure as shown in FIG. 4D is provided in the present embodiment, and the composite layer 141 of the capping layer 140 in the organic light emitting display device is in direct contact with the second electrode 120. In the present embodiment, the material of the composite layer 141 contains an organic material and a metal dopant, and the metal dopant has a higher electrical conductivity, and when the metal dopant is doped into the organic material, the conductivity of the composite layer 141 can bed improved. Since the composite layer 141 is in direct contact with the second electrode 120, the composite layer 141 may be multiplexed as an auxiliary electrode for the second electrode 120. When the second electrode 120 is energized, the current flows through the composite layer 141 and the second electrode 120, and the resistance is relatively small based on the large thickness of the composite layer 141 and the second electrode 120, thus the current flowing through the second electrode 120 is increased so that the voltage drop of the second electrode 120 is reduced, thereby improving the problem of the unevenness of the display brightness of the device and enhancing the display brightness uniformity of the organic light emitting display device. Therefore, the capping layer 140 improves the color cast phenomenon and the problems of the display brightness unevenness of the device and enhances the display brightness uniformity of the organic light emitting display device on the basis of ensuring high refractive index and light extraction efficiency, and the device can realize the lightweight of the organic light emitting display device without arranging a separate auxiliary electrode.

By way of example, the material of the first electrode 110 alternatively includes indium tin oxide (ITO) or indium zinc oxide (IZO), and the material of the second electrode 120 includes a metal material or a metal alloy material, on the basis of the above-described technical solution. Specifically, first electrode 110 includes a silver metal layer, ITO or IZO, and a silver metal layer stacked in turn. That is, the first electrode 110 is a totally reflective anode. The thickness of the metal film or the metal alloy film of the second electrode 120 is very thin, which can embody the semi-permeability and make the light to be transmitted. It will be understood by those skilled in the art that the constituent materials of the first electrode and the second electrode are various, including but not limited to the above examples, and the relevant practitioner may select by theirselves the constituent materials for forming the first electrode and the second electrode according to the requirements of products. The present disclosure is not particularly limited in this respect, and for example, in other alternative embodiments, the material of the second electrode includes any one of a magnesium silver alloy, a silver metal, a silver ytterbium alloy and a silver rare earth metal alloy.

On the basis of the exemplary technical solution as described above, the light emitting layer 130 alternatively includes a plurality of light emitting regions which emits a light of at least one color or only a white light. When the plurality of light emitting regions emit the light of at least one color, the organic light emitting material used in the light emitting region corresponding to the different light emitting colors of the light emitting layer 130 is different. When the plurality of light emitting regions emit only the white light, the organic light emitting material used in the light emitting regions corresponding to the different light emitting colors of the light emitting layer 130 may be the same. When the plurality of light emitting regions emit only the white light, a plurality of color filter films respectively corresponding to the plurality of light emitting regions are arranged on the light emitting layer 130 of the organic light emitting display device, and the plurality of color filter films include at least one of a red R filter film, a green G filter film, and a blue B filter film.

It will be understood by those skilled in the art that the structure illustrated in this embodiment is only a partial structure of the organic light emitting display device and that the organic light emitting display device also includes other structures such as a thin film transistor array substrate, a color film substrate, or a thin film encapsulation layer. When a color filter film is provided in the organic light emitting display device, the color filter film may be produced at a plurality of positions, for example, directly on the capping layer or on a color film substrate. In the present disclosure, the position at which color filter film is produced is not limited specifically.

Alternatively, by way of example, a light refractive index of the capping layer 140 is greater than or equal to 1.4, and a light absorption coefficient of the capping layer 140 is less than or equal to 0.01 at a wavelength of 400 nm or more, on the basis of the above-described technical solution. The light refractive index of the capping layer 140 doped with the metal dopant in this embodiment is greater than or equal to 1.4, and thus the light can be satisfactorily transmitted through the capping layer 140 to ensure that the capping layer 140 has a higher light extraction efficiency. Moreover, the light absorption coefficient of the capping layer 140 is less than or equal to 0.01 at a wavelength of 400 nm or more, the loss of the light passing through the capping layer 140 is less, which makes sure that the transmittance of the capping layer 140 is up to 90%. In this way, the capping layer 140 can protect the second electrode 120 and the light-emitting layer 130 from the degradation of the external moisture or oxygen, and meanwhile, has the effects of enhancing the light extraction efficiency and improving the color cast in the angle of view.

Alternatively, the material of the metal dopant in this embodiment includes one or more of Ag, Mg, Yb, and Li. The metal dopants, such as Ag, Mg, Yb, Li, have a higher reflection and refraction performance, in which one or more of the dopants are doped into the organic material to form the composite layer 141 without significantly reducing the refractive index of the capping layer 140, thereby ensuring that the light refractive index of the capping layer 140 is greater than or equal to 1.4 and the light absorption coefficient at a wavelength of 400 nm or more can be less than or equal to 0.01, and that the capping layer 140 has a transmittance of up to 90% and a higher light extraction efficiency. It will be understood by those skilled in the art that the metal dopants of the present disclosure include, but are not limited to, the above examples. On the basis of ensuring that the light refractive index of the capping layer is greater than or equal to 1.4 and the light absorption coefficient at wavelengths of 400 nm or more is less than or equal to 0.01, any metal dopant falls within the scope of protection of the present disclosure and will not be described here.

By virtue of use of the organic material, the capping layer has a higher refractive index so that the light extraction efficiency of the capping layer is higher, and in the present embodiment, alternatively, the mass ratio of the organic material in the composite layer 141 is grater than or equal to 10% and less than or equal to 90%. The metal dopants have good reflectivity and refractive properties, so when they are doped into the organic material, the refractive index of the organic material would not be significantly reduced, and the organic material contained in the composite layer 141 can ensure that the capping layer has the higher refractive index and the higher light extraction efficiency.

Alternatively, the refractive index of the organic material in the composite layer 141 is greater than 1.6 in the wavelength range of 400 nm to 700 nm, and the good reflection and refraction properties of the metal dopant would not significantly reduce the refractive index of the organic material when the metal dopant is doped into the organic material. The composite layer 141 containing the organic material can be guaranteed to have a higher refractive index, and accordingly, the refractive index of the capping layer 140 having at least one composite layer 141 can be guaranteed to be greater than or equal to 1.4, thereby ensuring that the capping layer 140 has the transmittance of up to 90% and a higher light extraction efficiency.

Alternatively, the thickness H of the capping layer 140 as shown in FIG. 4B is greater than or equal to 50 nm and less than or equal to 90 nm, based on the exemplary embodiments as described above. When the thickness H of the capping layer 140 is too thick or too thin, it may affect the light output characteristics of the capping layer 140. It will be understood by those skilled in the art that the thickness of the capping layer is not limited to the above-described thickness range and that the relevant practitioners can set the thickness of the capping layer by themselves according to the requirements of product in actual production.

According to the organic light emitting display device provided in the present embodiment, the capping layer includes at least one composite layer, the constitutent material of composite layer includes an organic material and a metal dopant. In the present embodiment, the composite layer contains the organic material, and thus the capping layer has a higher refractive index and a higher light extraction efficiency. The composite layer further contains the metal dopant which has good reflection and refraction properties by itself. When the organic material is doped into the organic material, the refractive index of the capping layer is not significantly reduced, so that the light extraction efficiency of the capping layer could not be affected, and that the higher refractive index and light extraction efficiency of the capping layer can be ensured. In the embodiment, after the light emitted from the light emitting layer enters the capping layer, the metal dopant in the capping layer can reflect and refract the light, so the portion of the light is changed in propagation direction and is scattered in different directions. Therefore, when the viewer observes the organic light emitting display device from various angles, it is possible to see the scattered light, thereby reducing the color cast phenomenon.

Figure 4E:
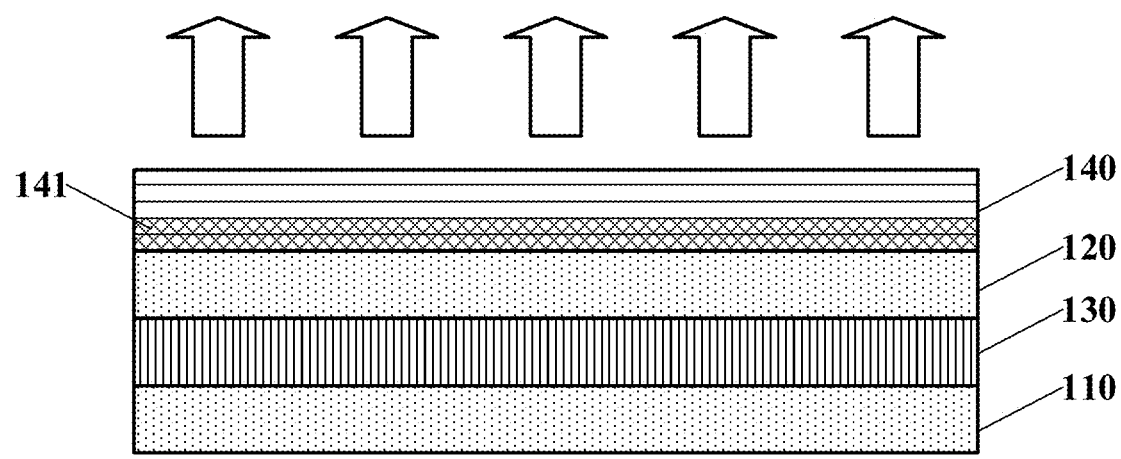
Figure 4F:
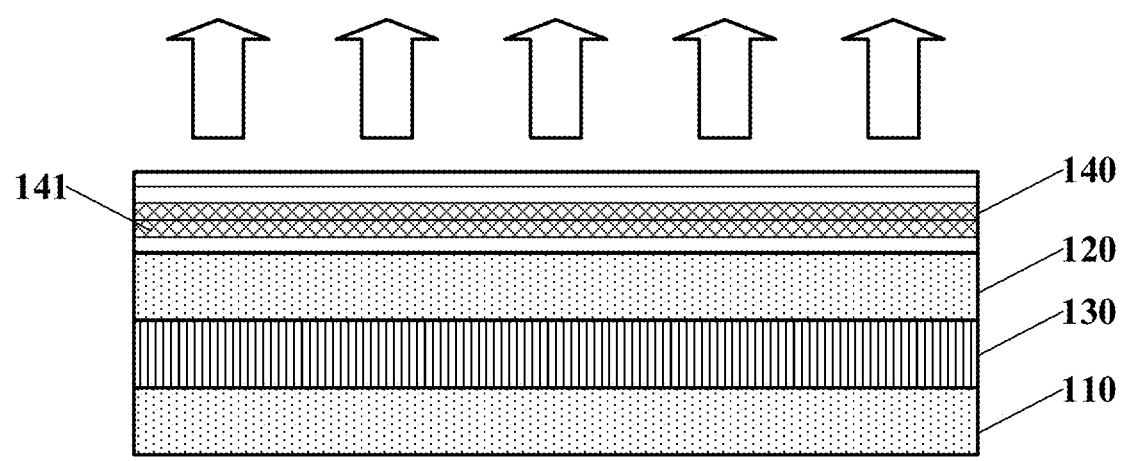

By way of example, the embodiment further provides an organic light emitting display device in which the capping layer of the organic light emitting display device is a multilayer superposed structure and at least two layers are composite layers, on the basis of above technical solution. The organic light emitting display device provided by the present embodiment differs from any of the above embodiments in that at least two of the composite layers meet at least one of the following conditions: i) the organic materials of at least two layers of the composite layers are different; ii) the metal dopants of at least two layers of the composite layers are different; and iii) the mass ratio of the organic materials of at least two layers of the composite layers is different. With reference to FIGS. 3 and 4C to 4F, the organic light emitting display device provided by the present embodiment includes at least two composite layers 141 which meet at least one condition as described above. At least two composite layers 141 are not in contact as shown in FIG. 4C, or at least two composite layers 141 are in direct contact as shown in FIGS. 4E and 4F.

The refractive index of the different organic materials may be different, and the refractive index of the formed capping layer 140 may also be different, and furthermore the light extraction efficiency of the capping layer 140 may be different. Therefore, when the capping layer 140 includes at least two composite layers 141 and the organic materials of at least two composite layers 141 are different, the refractive index of the capping layer 140 can be flexibly adjusted at the time of manufacture to obtain the desired light extraction efficiency. The refractive index of the different metal dopants may be different, and the effect of light scattering is different. Therefore, when the capping layer 140 includes at least two composite layers 141 and the metal dopants of the at least two composite layers 141 are different, the refractive index and the scattering effect of the capping layer 140 can be flexibly adjusted at the time of manufacture to obtain the desired light extraction efficiency and to improve the color cast effect. The weight ratio of the organic material is different, and the parameters such as the refractive index or the like, of the corresponding composite layer 141 are different. Thus, when the mass ratio of the organic material of at least two composite layers 141 of the capping layer 140 is different, the parameters such as the refractive index, light extraction efficiency or the like, of the capping layer 140 can be adjusted. If the mass ratio of different organic material is different, the conductivity of the corresponding composite layer 141 is different. As a result, the mass ratio of the organic material of at least two composite layers 141 of the capping layer 140 is different such that the conductivity of the composite layer 141 may be adjustable.

By way of example, another embodiment provides an organic light emitting display device in which the metal dopant in the composite layer is alternatively Yb, on the basis of above technical solution. Specifically, when the metal dopant in the composite layer is alternatively Yb, the mass ratio of the metal dopant in the composite layer is less than or equal to 50%. In order to clearly explain the relationship between the refractive index and the light absorption coefficient of the capping layer and the metal dopant, the mass ratio of the metal dopants in the capping layer is different according to the various capping layers provided in the present embodiment.

Figure 5A:
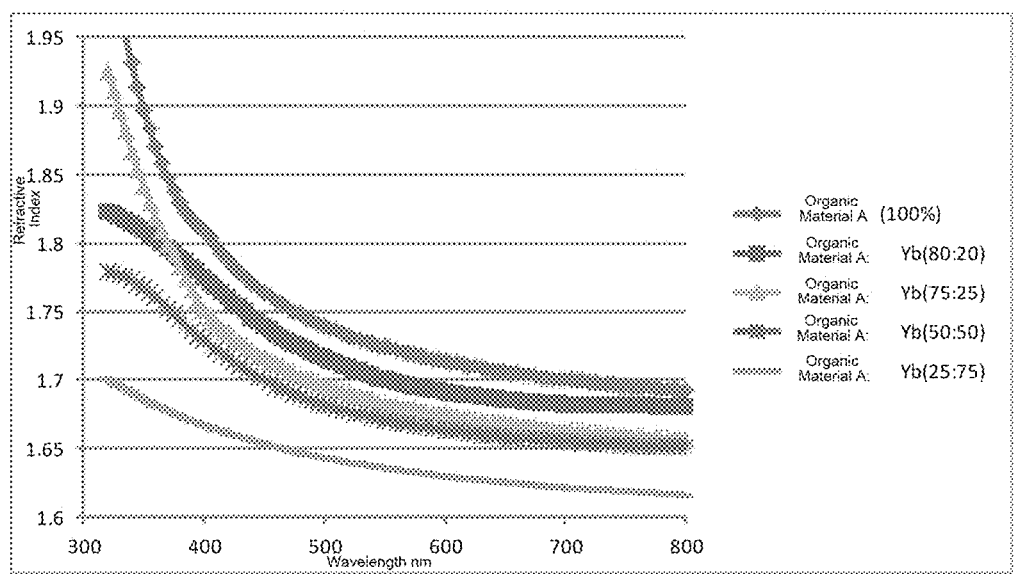
FIGS. 5A to 5D are curves of refractive index, light absorption coefficient and transmittance of the capping layer according to another embodiment, and a voltage-current diagram of the organic light emitting display device.
Figure 5B:
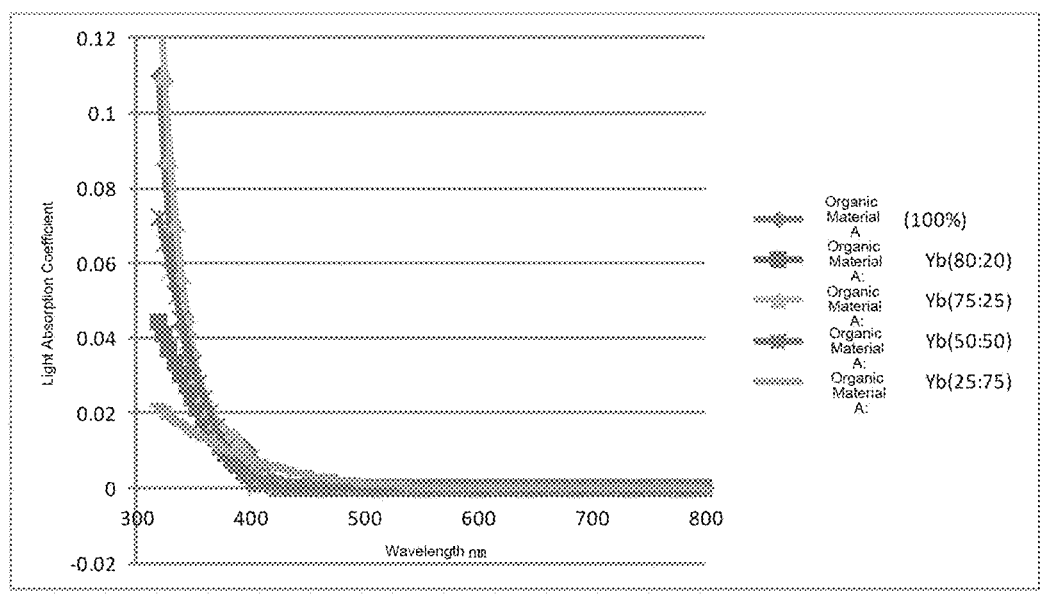
Figure 5C:
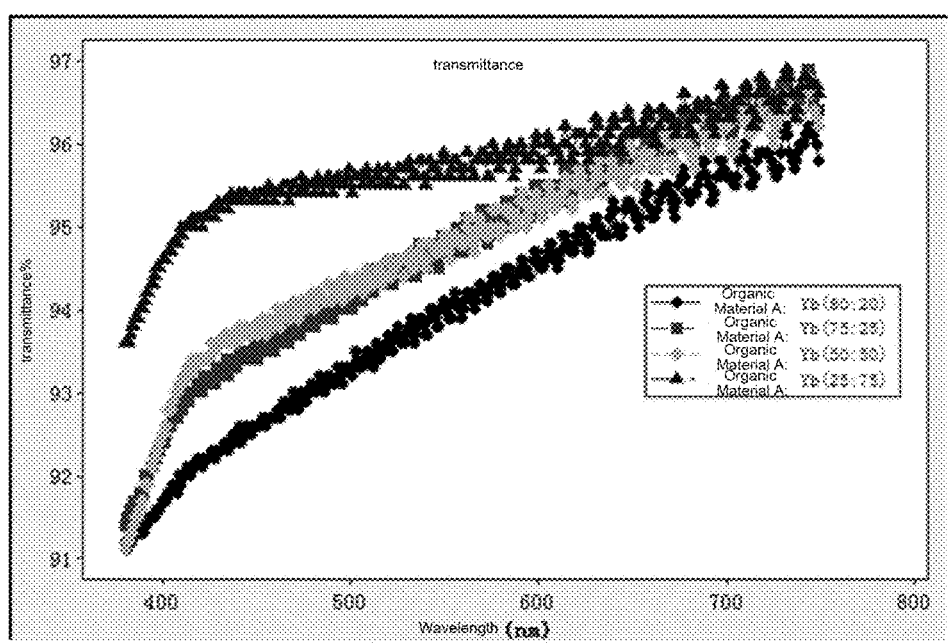

FIGS. 5A to 5C show curves of refractive index, light absorption coefficient and transmittance of four capping layers according to the embodiments of the present disclosure, in which the laminated structures of four kinds of capping layers are completely consistent and tanking FIG. 5A as an example, the differences lie in only:

The mass ratio of the organic material in the composite layer of the first capping layer L1 is 80%, and the mass ratio of Yb in the composite layer is 20%, that is, the organic material:Yb=80:20;

The mass ratio of the organic material in the composite layer of the second capping layer L2 is 75%, and the mass ratio of Yb in the composite layer is 25%, that is, the organic material:Yb=75:25;

The mass ratio of the organic material in the composite layer of the third capping layer L3 is 50%, and the mass ratio of Yb in the composite layer is 50%, that is, the organic material:Yb=50:50;

The mass ratio of the organic material in the composite layer of the fourth capping layer L4 is 25%, and the mass ratio of Yb in the composite layer is 75%, that is, the organic material:Yb=25:75;

The mass ratio of the organic material in the capping layer of the existing capping layer L5 is 100%.

It can be seen from FIG. 5A that, the refractive index of the first capping layer L1 is greater than or equal to 1.68 in the wavelength range of 300 nm to 800 nm; the refractive index of the second capping layer L2 is greater than or equal to 1.66 in the wavelength range of 300 nm to 800 nm; the refractive index of the third capping layer L3 is greater than or equal to 1.65 in the range of 300 nm to 800 nm; and the refractive index of the fourth capping layer L4 is greater than or equal to 1.61 in the range of 300 nm to 800 nm. The refractive index of the existing capping layer (organic material: 100%) is greater than or equal to 1.69 in the wavelength range of 300 nm to 800 nm, and therefore, the refractive index is higher than that of the inorganic material LiF commonly used in the capping layer, and therefore the higher light extraction efficiency can be achieved. However, due to the higher refractive index of organic materials, the less angle of view of the organic light-emitting display device, serious color cast and so on are caused. As can be seen from the test results shown in FIG. 5A, the refractive index of the capping layer gradually decreases as the mass ratio of the metal Yb increases. However, the refractive index of the capping layer is only slightly reduced, that is, even if the mass ratio of Yb is 75%, the refractive index of the capping layer is still in the range of more than 1.6. In summary, the addition of the metal dopant does not result in a significant reduction in the refractive index of the capping layer, and even a slight decrease in the refractive index of the metal can already ensure a higher light extraction efficiency.

It can be seen from FIG. 5B that, the light absorption coefficient of the first capping layer L1 is approximately equal to 0.003 at a wavelength of 400 nm; the light absorption coefficient of the second capping layer L2 is approximately equal to 0.007 at a wavelength of 400 nm; the light absorption coefficient of the third capping layer L3 is approximately equal to 0.004 at a wavelength of 400 nm; and the light absorption coefficient of the fourth capping layer L4 is approximately equal to 0.008 at a wavelength of 400 nm. The light absorption coefficient of the conventional capping layer (organic material: 100%) is approximately equal to 0.01 at a wavelength of 400 nm. It is also seen from FIG. 5B that the light absorption coefficient of the fourth capping layer L4 is much greater than that of the first cap L1, the second capping layer L2 and the third capping layer L3 in the wavelength range of 400 nm to 500 nm. In combination with the light absorption coefficient of the existing capping layer, it is clear that the light absorption coefficient of the capping layer is the smallest when the mass ratio of Yb is 20%. It is known that the smaller the light absorption coefficient of the capping layer is, the less the loss in the light propagation process, and the higher the light extraction efficiency of the organic light emitting display device. Therefore, in the case where the other conditions are the same, the fourth capping layer L4 with the mass ratio of Yb being More than 50%, among L1 to L4, has the largest light absorption coefficient, and the corresponding light extraction efficiency of the corresponding organic light emitting display device is the lowest. Although the addition of Yb will lead to an increase in the light absorption coefficient, the increase is not obvious to a great extent. For instance, the maximum difference in light absorption coefficient is only 0.007, which is very small. Therefore, the addition of Yb has no substantial effect on the light extraction efficiency of the capping layer.

It can be seen from FIG. 5C that, the transmittance of the first capping layer L1 at a wavelength of 400 nm or more is greater than 91%, the transmittance of the second capping layer L2 at a wavelength of 400 nm or more is greater than 91%, the transmittance of the third capping layer L3 at a wavelength of 400 nm or more is greater than 91%, and the transmittance of the fourth capping layer L4 at a wavelength of 400 nm or more is greater than 94%. The transmittance of the conventional capping layer is usually up to 90% or more, and in this embodiment, when Yb is doped into the organic material, Yb not only does not decrease the transmittance of the capping layer, but substantially increases the transmittance of the capping layer. Further, as the mass ratio of Yb in the composite layer increases, the transmittance of the capping layer becomes higher.

As described above, after the metal Yb is doped into the organic material, it is possible to ensure that the light absorbing coefficient of the capping layer is small and the refractive index is high as long as a certain concentration (less than 50%) is maintained. Accordingly, the effect of the metal dopant on the light output is small, even nearly no impact on the light absorption, and correspondingly the capping layer adopting the organic materials can guarantee the higher refractive index and light extraction efficiency. Specifically, although the transmittance of the fourth capping layer L4 is higher than that of the other three capping layers, the light absorption coefficient thereof is greater than that of the other three capping layers and the refractive index thereof is lower than that of the other three capping layers. Also, the difference between the transmittance of the fourth capping layer L4 at a wavelength of 650 nm or more and the other three capping layers is small. Therefore, when the metal dopant in the composite layer is Yb by taking into consideration of the light extraction efficiency and the transmittance of the organic light emitting display device, the mass ratio of the metal dopant in the composite layer is less than or equal to 50%, which ensures the higher light extraction efficiency and the higher transmittance of the organic light emitting display device.

In order to clearly illustrate the technical solution of the present embodiment, the present embodiment also provides a plurality of red organic light emitting display (EOD) devices including an anode (ITO), an electron transport layer, a cathode (Mg:Ag), and a capping layer. The organic light-emitting display (EOD) device does not include a light emitting layer, and is a commonstructure in the art commonly used to verify the electrical performance of the newly designed organic light emitting display device.

Specifically, the difference between each organic light-emitting display (EOD) devices lies in only:

The thickness of the capping layer of the first organic light emitting display (EOD) device Q1 is 70 nm, and the capping layer is made of organic materials A and Yb, the organic material A:Yb=75:25;

The capping layer of the second organic light emitting display (EOD) device Q2 includes a composite layer and a barrier layer; the composite layer has a thickness of 30 nm, and is made of organic materials A and Yb, organic material A:Yb=75:25; and the thickness of the barrier layer is 40 nm and is made of an organic material A;

The capping layer of the third organic light emitting display (EOD) device Q3 includes a composite layer and a barrier layer; the composite layer has a thickness of 30 nm, and is made of organic materials A and Yb, organic material A:Yb=75:25; and the thickness of the barrier layer is 40 nm and is made of LiF;

The thickness of the capping layer of fourth organic light emitting display (EOD) device Q4 has a of 70 nm and is made of an organic material A;

The thickness of the capping layer of fifth organic light emitting display (EOD) device Q5 has a of 70 nm and is made of LiF.

After optical tests, the optical properties of Q1~Q5 are shown in the table below, where Frit is laser sintered glass powder packaging technology and TFE is film packaging technology:

|    | Packaging form | Light extraction efficiency (%) | Color cast in viwing angle @ 60° |
|----|----|----|----|
| Q1 | Frit | 108 | 0.045 |
| Q2 | Frit | 105 | 0.043 |
| Q3 | TFE | 95 | 0.045 |

-continued

|    | Packaging form | Light extraction efficiency (%) | Color cast in viwing angle @ 60° |
|----|----|----|----|
| Q4 | Frit | 100 | 0.065 |
| Q5 | TFE | 85 | 0.067 |

Here, the light extraction efficiency of the organic light emitting display (EOD) device indicated by Q4 is taken as baseline. Namely, the light extraction efficiency of Q4 is characterized as 100%. The light extraction efficiency of the organic light emitting display (EOD) device indicated by Q1 reaches 108% of Q4, and the color cast of Q1 at the angle of view of 60° is 0.045. The light extraction efficiency of the organic light emitting display (EOD) device indicated by Q2 reaches 105% of Q4, and the color cast of Q2 at the angle of view of 60° is 0.043. The light extraction efficiency of the organic light emitting display (EOD) device indicated by Q3 reaches merely 95% of Q4, and the color cast of Q3 at the angle of view of 60° is 0.045. The light extraction efficiency of the organic light emitting display (EOD) device indicated by Q5 reaches merely 85% of Q4, and the color cast of Q5 at the angle of view of 60° is 0.067.

It is obvious that the light extraction efficiency of the organic light emitting display (EOD) device indicated by Q1 and Q2 is higher than that of Q4 and the color cast at the angle of view of 60° is lower than that of Q4; Q3 satisfies the requirements of film packaging, but the light extraction efficiency thereof is lower than Q4, and the color cast at the angle of view of 60° is lower than Q4; and the organic light emitting display (EOD) device indicated by Q5 meets the requirements of film packaging, but the light extraction efficiency is lower than Q4, and the color cast at the angle of view of 60° is higher than Q4.

In order to clearly illustrate the technical solution of the present embodiment, the present embodiment also provides two kinds of organic light emitting display devices, each of which includes an anode (ITO), an electron transport layer (electron transport material and Liq), a cathode (Mg:Ag), and a capping layer.

Specifically, the difference between the two organic light-emitting display (EOD) devices lies in only:

The capping layer of the first organic light emitting display (EOD) device is made of organic material A, where the organic material A may be aromatic compounds;

The capping layer of the second organic light emitting display (EOD) device is made of organic material A and Yb, organic material A:Yb=50:50.

Figure 5D:
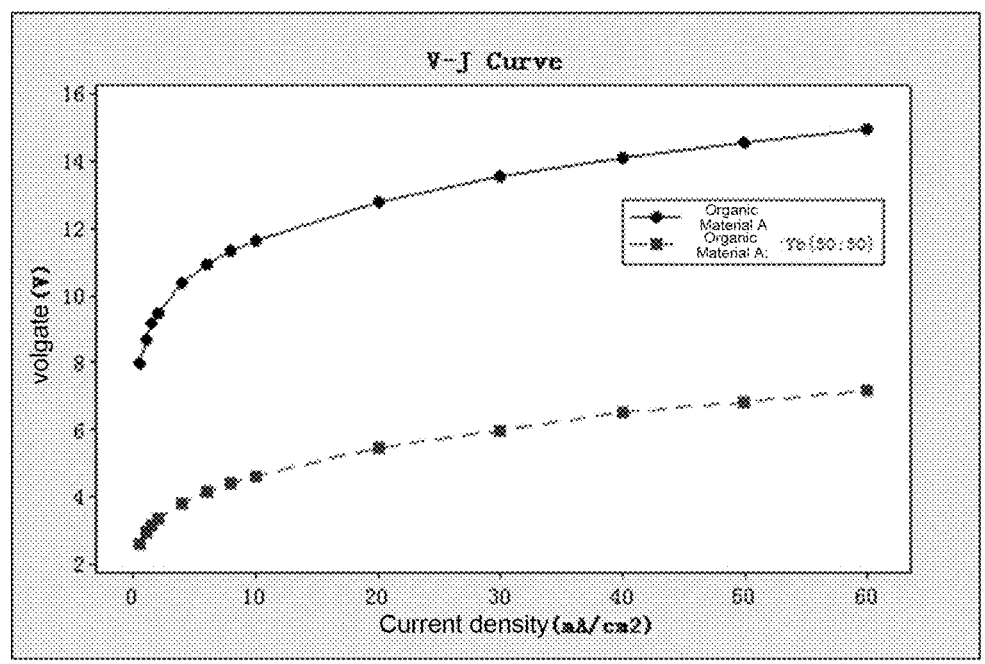

FIG. 5D shows a diagram of the voltage-current density curve (V-J curve) of two organic light emitting display (EOD) devices, where the voltage is in V and the current density is in mA/cm². As shown in FIG. 5D, the first organic light emitting display (EOD) device using the pure organic material A as the capping layer has a thin cathode and a greater square resistance, which results in a large voltage drop of the cathode and a severe display brightness unevenness. The second organic light emitting display (EOD) device with Yb doped into organic material A as the capping layer increases the electrical conductivity of the capping layer, so that the capping layer can be multiplexed as an auxiliary electrode, thereby increasing the equivalent thickness of the cathode. Also, the less square resistance makes the voltage drop of the cathode lower, and the problem of uneven display brightness can be improved. Obviously, the second organic light emitting display device improves the display brightness unevenness and improves the display effect. It is to be noted that in the organic light emitting display (EOD) device corresponding to the test results shown in FIG. 5D, the composite layer in the capping layer is in direct contact with the cathode.

Figure 6A:
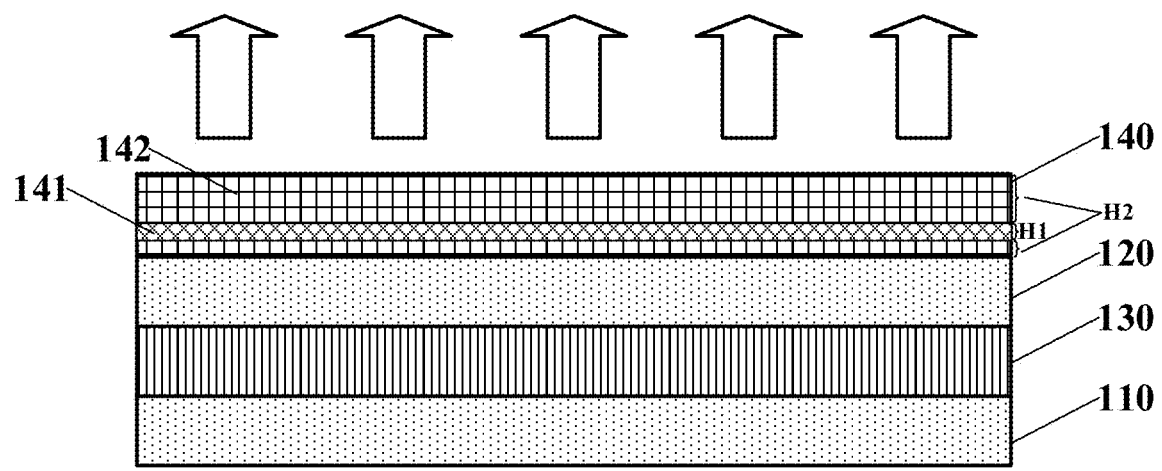
FIGS. 6A to 6C are schematic views of a plurality of organic light emitting display devices according to still another embodiment.
Figure 6B:
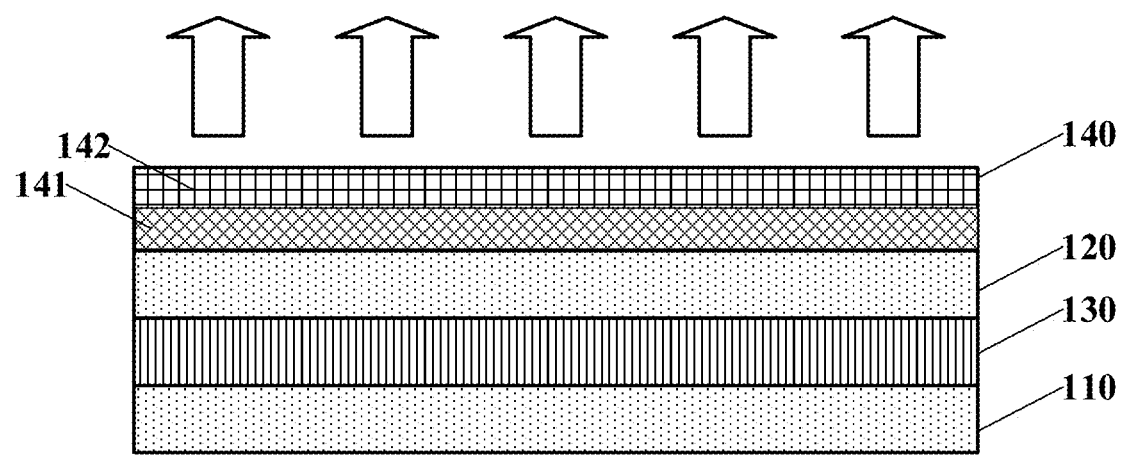
Figure 6C:
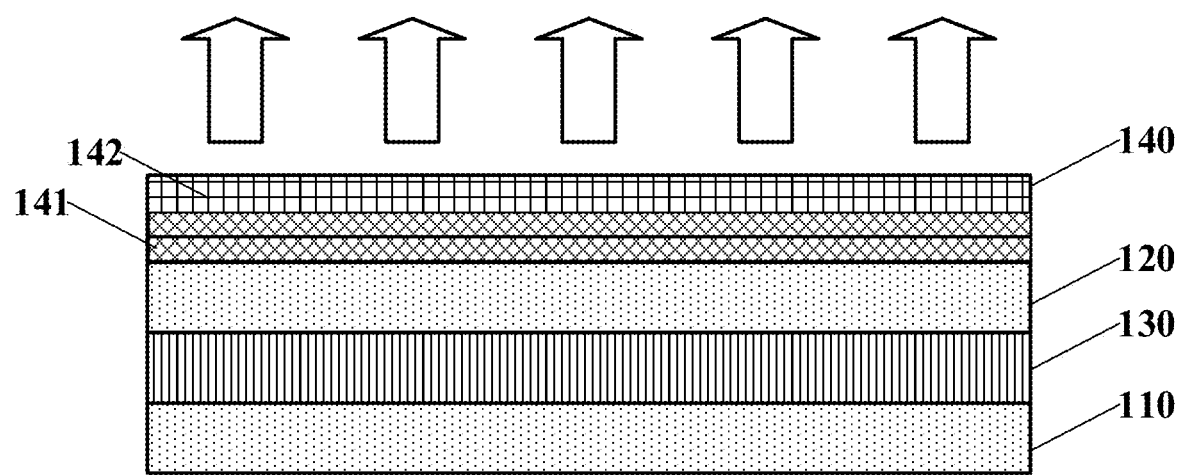

By way of example, a further embodiment provides an organic light emitting display device, on the basis of the above technical solution. The organic light emitting display device differs from any of the embodiments described above in that, as shown in FIG. 6A, a capping layer 140 is alternatively a multilayer superposed structure in which at least one of the layers is a barrier layer 142 and the material of the barrier layer 142 includes any one of an inorganic material, an organic material, a mixed material of the inorganic material and the organic material, a mixed material of the inorganic material and a metal dopant, and a mixed material of the inorganic material, the organic material and the metal dopant. In particular, the material of the capping layer generally includes an inorganic material and an organic material. Therefore, the capping layer 140 of the present embodiment includes at least one composite layer 141 and the remaining is the barrier layer 142. In order to more clearly describe the organic light emitting display device provided in the present embodiment, the illustration is shown only on the basis of FIG. 4B. Alternatively, the capping layer 140, as shown in FIG. 6B, includes at least one composite layer 141 and one barrier layer 142. Alternatively, the capping layer 140, as shown in FIG. 6C, includes at least two composite layers 141 and one barrier layer 142.

When the material of the barrier layer 142 includes any one of an inorganic material, an organic material, a mixed material of the inorganic material and the organic material, a mixed material of the inorganic material and a metal dopant, and a mixed material of the inorganic material, the organic material and the metal dopant, the capping layer 140 can improve the color cast phenomenon at different angles of view of the organic light emitting display device by the inorganic material, and also can improve the refractive index and the light extraction efficiency by the organic material, and also improve the electrical conductivity through the metal dopants. Moreover, it is possible to block the outside water or oxygen from entering the inside of the device so as to protect the second electrode 120 and the light emitting layer 130 from the degradation due to external moisture or oxygen.

Alternatively, the thickness H1 of the composite layer 141 is 30 nm, and the thickness H2 of the barrier layer 142 is 40 nm.

Figure 7:
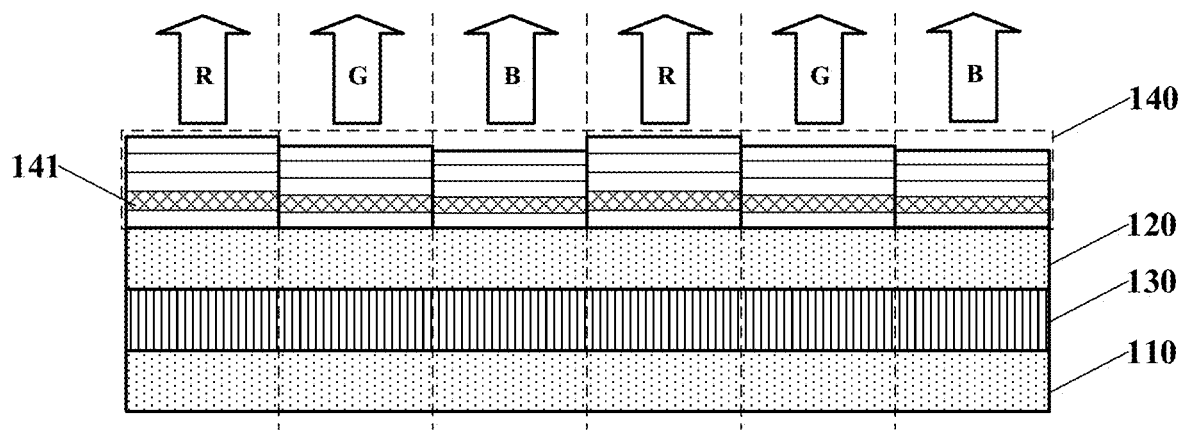
FIG. 7 is a schematic view of another organic light emitting display device according to still another embodiment.

By way of example, another embodiment further provides another organic light emitting display device, on the basis of the above technical solution. As illustrated in FIG. 7, the light emitting layer 130 of the organic light emitting device includes a plurality of light emitting regions corresponding to a plurality of pixel regions, respectively, which include m kinds of light emission colors, where m is an integer greater than or equal to one, and the capping layer 140 includes a plurality of cap regions that are provided correspondingly to the plurality of pixel regions, respectively, where the thickness of the cap regions corresponding to the pixel regions of any two light emission colors is different. In order to more clearly describe the organic light emitting display device according to the present embodiment, the illustration is made only on the basis of FIG. 4B.

Alternatively, the organic light emitting display device of the present embodiment includes a plurality of pixel regions which have at least one of an R pixel region, a G pixel region, and a B pixel region. Alternatively, as shown in FIG. 7, the organic light emitting display device includes three pixel regions of Red, Greem and Blue channels (RGB). The light emitting layer 120 includes a plurality of light emitting regions, and the capping layer 140 includes a plurality of cap regions, where the light emitting region and the cap region corresponding to the R pixel region are defined as a first light emitting region and a first cap region, respectively, and the light emitting region and the cap region corresponding to the G pixel region are defined as a second light emitting region and a second cap region, respectively, and the light emitting region and the cap region corresponding to the B pixel region are defined a third light emitting region and a third cap region, respectively.

Here, the capping layer 140 can be used to adjust the length of the microcavity structure (referred to as the cavity length) and the cavity lengths of the pixel regions of the different light emission colors are different. In the present embodiment, the thickness of the cap region corresponding to the pixel regions of any two light emission colors is different. In the actual production, the relevant practitioners can set the thickness of the first cap region, the second cap region, and the third cap region according to the requirements for product by themselves. In the present disclosure, the thickness of the cap region corresponding to the pixel region of the different light emission color is not particularly limited.

Alternatively, according to the present embodiment, the guest material of the first light emitting region includes a phosphorescent material, the guest material of the second light emitting region includes a phosphorescent material, and the guest material of the third light emitting region includes a fluorescent material. The guest material of the first and second light emitting regions each includes a phosphorescent material and has an advantage of higher light extraction efficiency and longer life. The guest material of the third light emitting region includes the fluorescent material, which has the advantage of long life. It will be understood by those skilled in the art that the guest material of the first light emitting region and/or the second light emitting region may also contain a fluorescent material, and the guest material of the third light emitting region may also contain a phosphorescent material, and the relevant practitioners themselves may select the guest materials of the first, second and third light emitting regions according to the requirements for products, and the present disclosure is not particularly limited in this respect.

The first, second and third light emitting regions also contain the host material, respectively. It will be understood by those skilled in the art that the triplet energy level $T1_{HR}$ of the host material of the first light emitting region is greater than the triplet energy level $T1_{DR}$ of its guest material, the triplet energy level $T1_{HG}$ of the host material of the second light emitting region is greater than the triplet energy level $T1_{DG}$ of its guest material, and the triplet energy level $T1_{HB}$ of the host material of the third light emitting region is greater than the triplet energy level $T1_{DB}$ of its guest material. If the energy level of the host material and the guest material in the light emitting region meets the above conditions, the triplet exciton energy of the host material in the light emitting region can be transferred to the triplet exciton energy of the guest material. In addition, the host material and the guest material in the light emitting area need to meet that the emission spectrum of the host material and the absorption spectrum of the guest material must overlap to some extent. In the case where the above conditions are satisfied, the light emitting region can realize electroluminescence.

Figure 8A:
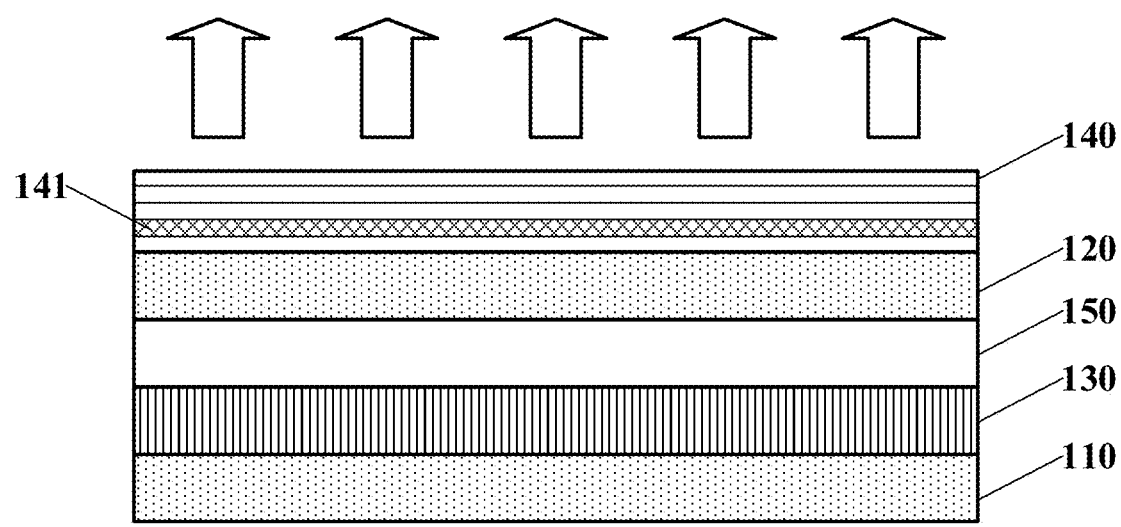
FIGS. 8A to 8C are schematic views of a plurality of organic light emitting display devices according to a further embodiment.

By way of example, a further embodiment provides an organic light emitting display device which differs from any of the embodiments described above in that, as shown in FIG. 8A, a functional layer 150 is further included, the first functional layer 150 is located between the light emitting layer 130 and the second electrode 120, and the first functional layer 150 includes at least an electron transport layer having an refraction index of less than 1.8 in the wavelength range of 400 nm to 700 nm. In order to more clearly describe the structure of the present embodiment, the organic light emitting display device shown in FIG. 4B is illustrated herein as an example.

In the present embodiment, the first functional layer 150 is located between the light emitting layer 130 and the second electrode 120, and the first functional layer 150 includes at least an electron transport layer. The first functional layer 150 is used to enhance the ability of the second electrode 120 in terms of electron injection and transport to the light emitting layer 130, thereby improving carrier recombination efficiency and balancing the injection and transport of carriers. In particular, the electron transport layer in the first functional layer 150 can block the excitons in the light emitting layer 130 from transitioning in a direction toward the second electrode 120, so that the electron transport layer can restrict the excitons within the light emitting layer 130, thereby increasing the luminous efficiency of the light emitting layer 130. In the present embodiment, the refractive index of the electron transport layer is less than 1.8 in the wavelength range of 400 nm to 700 nm, and the light extraction efficiency of the organic light emitting display device can be improved.

It will be appreciated by those skilled in the art that, in other alternative embodiments, the first functional layer may further include at least one of an electron injection layer and a hole blocking layer, and thus the first functional layer not only improves the electron injection and transport capabilities, but also makes the energy barrier crossed upon the transition of electrons be at a minimum.

Alternatively, the host material of the electron transport layer includes aromatic compounds. The electron transport layer is formed as a single layer or superposition of a plurality of layers, where at least one layer is a first electron transport layer and the material of the first electron transport layer includes a guest dopant which may be metal or metal compound.

The aromatic compound has a larger conjugate plane, and its ability to receive electrons is better. At the same time, it can effectively transmit electrons under certain forward bias, which has the advantages such as electron deficiencies, high photoluminescence quantum efficiency, better thermal stability and chemical stability. The use of aromatic compounds for the electron transport layer can improve the luminous efficiency of the light emitting layer. It will be appreciated by those skilled in the art that the host material of the electron transport layer includes, but is not limited to, aromatic compounds, and the host material of the electron transport layer of the present disclosure includes any of the electron transport materials known in the art.

In the present embodiment, the first electron transport layer also includes a guest dopant, the guest dopant is metal or metal compound, and the metal or metal compound can improve the electron transition ability of the first electron transport layer, thereby contributing to the improvement of the luminous efficiency of the light emitting layer.

Alternatively, the host material of the first electron transport layer includes aromatic compounds, and the guest dopant of the first electron transport layer includes any one of an alkali metal, an alkaline earth metal, a rare earth metal, an alkali metal compound, and an alkaline earth metal compound and a rare earth metal compound.

When the aromatic compound is used as the host material of the first electron transport layer, the conductivity and the electron injection efficiency of the first electron transport layer can be improved, thereby reducing the driving voltage of the organic light emitting display device and improving the light emitting efficiency of the light emitting layer. Alkali metal, alkaline earth metal, rare earth metal, alkali metal compound, alkaline earth metal compound and rare earth metal compound are all active metals having a high reactivity, and doping the active metal into the first electron transport layer can improve the conductivity of the first electron transport layer and therefore the electron injection and migration, thereby significantly improving the luminous efficiency of the light emitting layer.

Figure 8B:
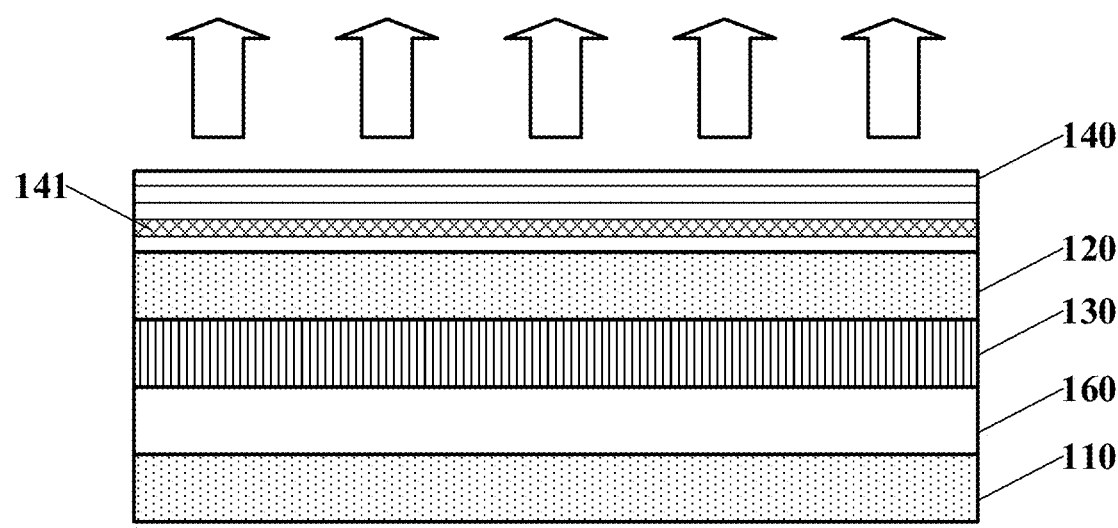

A further embodiment provides another organic light emitting display device which differs from any of the embodiments described above in that, as shown in FIG. 8B, the second functional layer 160 is further included, the second functional layer 160 is located between the first electrode 110 and the light emitting layer 130, and the second functional layer 160 includes at least a hole transport layer.

In the present embodiment, the second functional layer 160 is located between the first electrode 110 and the light emitting layer 130, and the second functional layer 160 includes at least a hole transport layer. The second functional layer 160 serves to enhance the ability of the first electrode 110 in terms of hole injection and transport to the light emitting layer 130, thereby improving the carrier recombination efficiency and balancing the injection and transport of the carriers. In particular, the hole transport layer in the second functional layer 160 can block the exciton in the light emitting layer 130 from transitioning in the direction toward the first electrode 110, and the hole transport layer is able to restrict the exciton within the light emitting layer 130, thereby increasing the luminous efficiency of the light emitting layer 130. It will be appreciated by those skilled in the art, that in other alternative embodiments, the second functional layer may further include at least one of a hole injection layer and an electron blocking layer, the second functional layer can not only improve the hole injection and transport, but also minimize the energy level barrier crossed upon the transition of holes.

It will be understood by those skilled in the art that the constitutent material of the hole transport layer of the present disclosure includes any known hole transporting material, which is not particularly limited in the present disclosure.

Figure 8C:
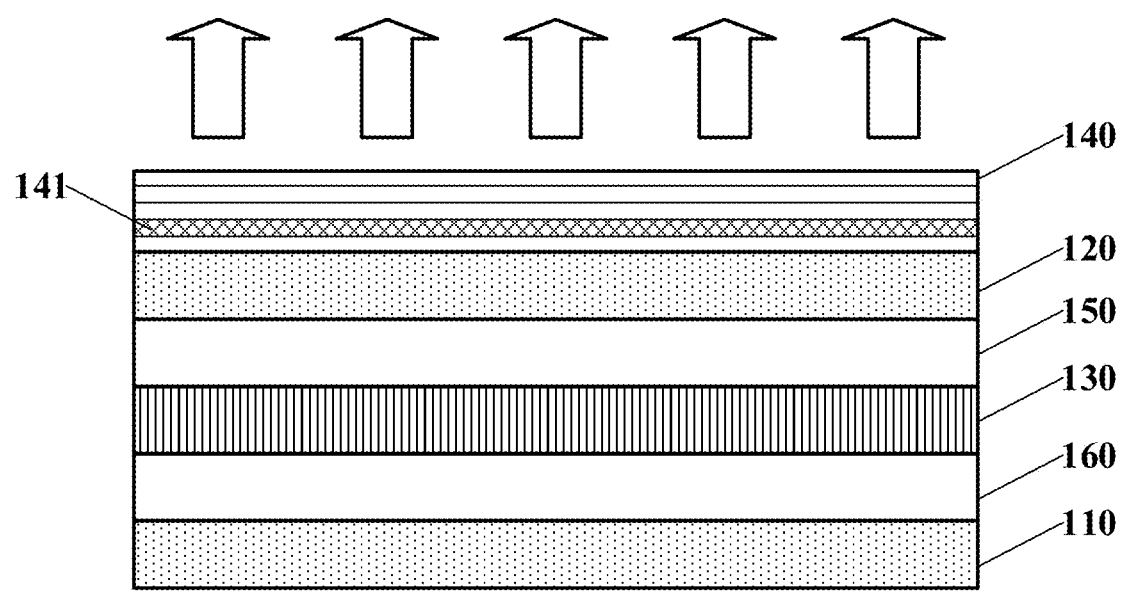

Another embodiment also provides a further organic light emitting display device which differs from any of the above embodiments in that, as shown in FIG. 8C, it further includes the first functional layer 150 and the second functional layer 160. The first functional layer 150 is located between the light emitting layer 130 and the second electrode 120, the first functional layer 150 includes at least an electron transport layer 150a, the second functional layer 160 is located between the first electrode 110 and the light emitting layer 130, and the second functional layer 160 includes at least a hole transport layer 160a. As the first functional layer 150 and the second functional layer 150 are provided in the organic light emitting display device, not only the electroninjection and input capability can be improved, but also the barrier obstacle occurred during the transition of electrons and holes can be reduced. The structure and function of the first functional layer and the second functional layer can be understood by those skilled in the art, and the detailed descriptions thereof are omitted here.

Figure 9:
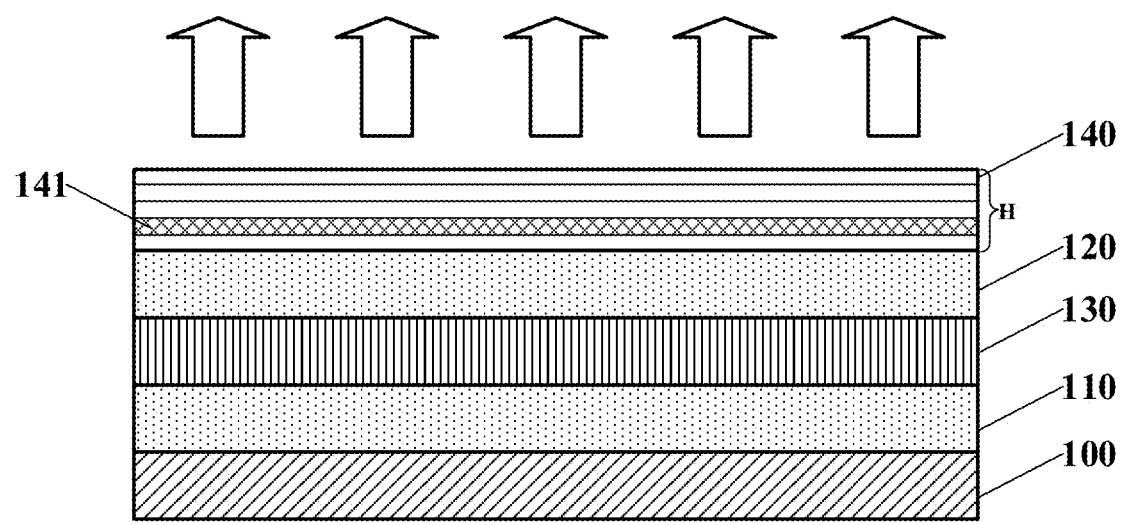
FIG. 9 is a schematic view of another organic light emitting display device according to a further embodiment.
Figure 10:
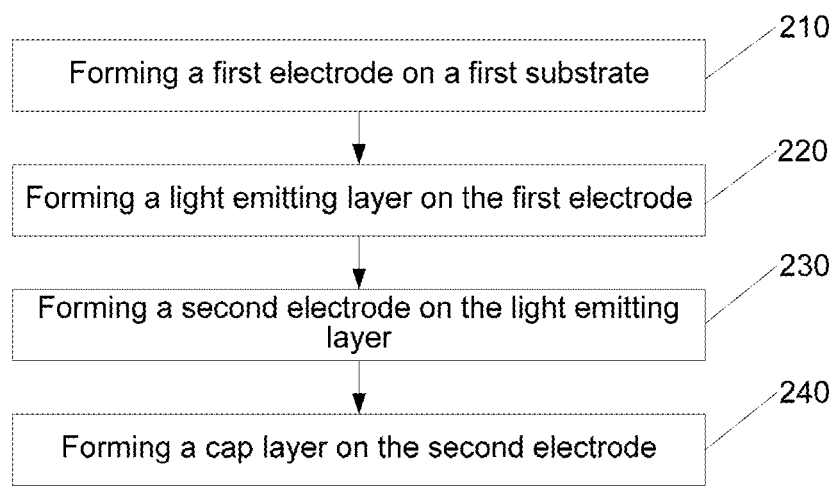
FIG. 10 is a schematic view of a method for manufacturing the organic light emitting display device according to the embodiments of the present disclosure.

A further embodiment further provides still another organic light emitting display device which differs from any of the above embodiments in that, as shown in FIG. 9, it further includes a first substrate 100 that is located at a surface of a side of the first electrode 110 facing away from the light-emitting layer 130 and may be a rigid substrate or a flexible substrate.

In the present embodiment, the first substrate 100 may be selected as a flexible substrate and encapsulated with a thin film encapsulation layer, and the corresponding organic light emitting display device is a flexible organic light emitting display device having a lower power consumption and a bendable property, which is suitable for a variety of display devices, especially for wearable display devices. Alternatively, the material of the flexible substrate in this embodiment is a polyimide or polyethylene terephthalate resin, and it will be understood by those skilled in the art that the material of the flexible substrate includes, but is not limited to, the above materials. Any material that can be utilized for the flexible substrate falls within the scope of protection of the present disclosure. It will be appreciated by those skilled in the art that the first substrate includes, but is not limited to, a flexible substrate, and in other alternative embodiments the first substrate may be selected as a rigid substrate and packaged by a thin film encapsulation layer or a cover package, and accordingly a rigid organic light emitting display device is provided. The organic light emitting display device of the present disclosure has a wide range of field of applications and will not be described or explained in detail in the present disclosure. Relevant practitioners themselves can choose the material of the first substrate according to the requirements for products.

Figure 11A:
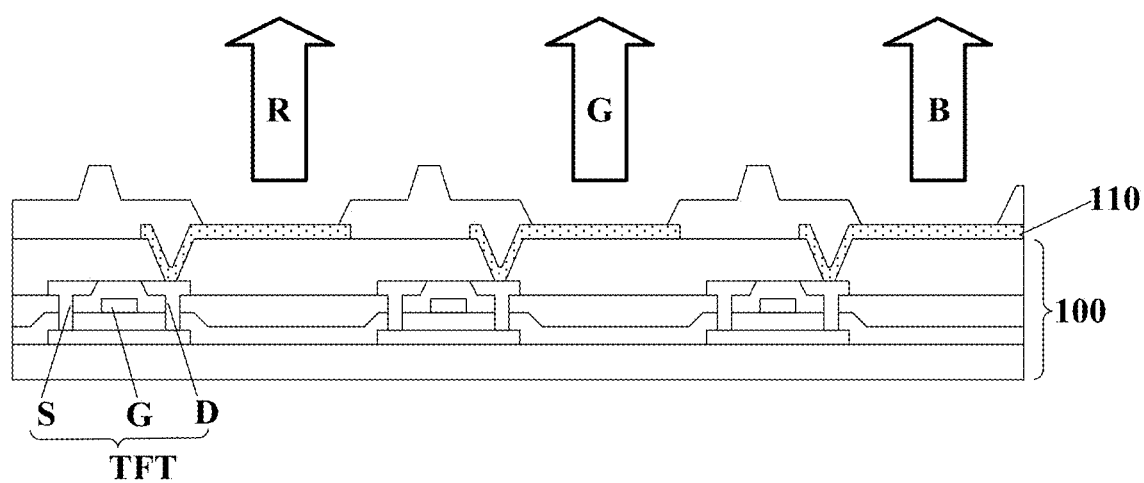
FIGS. 11A to 11D are flow charts of a method for manufacturing the organic light emitting display device according to the embodiments of the present disclosure.

On the basis of the above technical solution, an embodiment also provides a method of manufacturing the organic light emitting display device which is applied to the organic light emitting display devices according to any one of the embodiments described above. As illustrated in FIGS. 10 and 11A to 11D, the manufacturing method s includes:

At step 210, a first electrode 110 is formed on a first substrate 100 as shown in FIG. 11A.

The first substrate 100 shown in the present embodiment is a preformed array substrate, and a plurality of TFTs are provided. In the present embodiment, the first substrate 100 is alternatively a flexible substrate or a rigid substrate. Alternatively, the material of the first electrode 110 of the present embodiment includes ITO or IZO, and the first electrode 110 serves as a total reflection anode of the organic light emitting display device. It will be understood by those skilled in the art that the constituent materials of the first electrode include, but are not limited to, the above-described examples, and the relevant practitioners themselves may select the material of the first electrode according to the requirements for products.

Figure 11B:
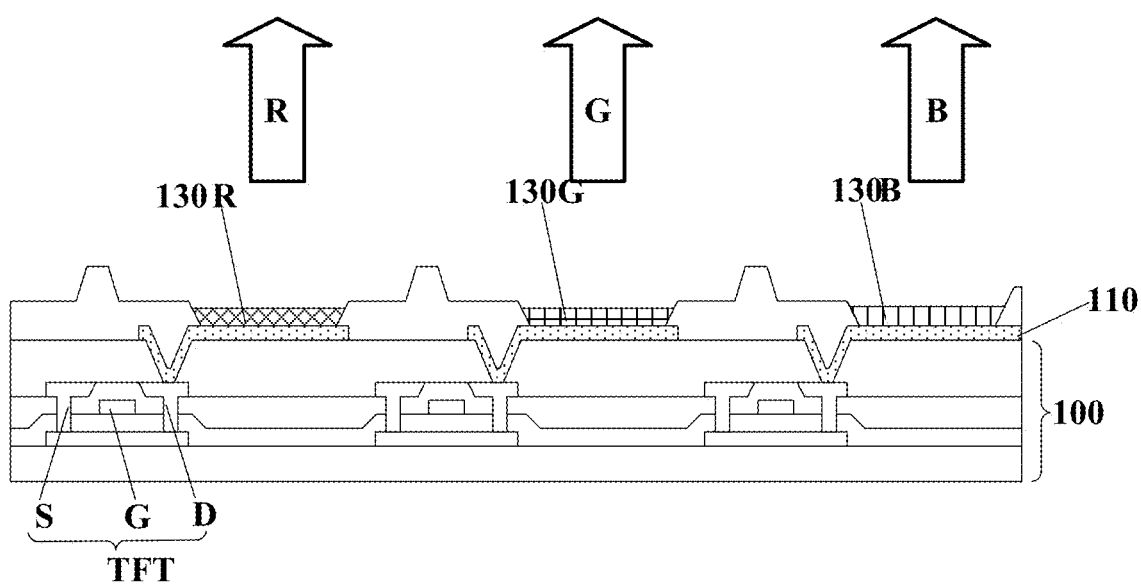

At step 220, a light emitting layer is formed on the first electrode 110 as shown in FIG. 11B, where the light emitting layer includes a plurality of light emitting regions which correspond to a plurality of pixel regions respectively, and the plurality of pixel regions include any one of an R pixel region, a G pixel region, and a B pixel region. In the present embodiment, the plurality of pixel regions may alternatively include an R pixel region, a G pixel region, and a B pixel region, and the light emitting layer includes a first light emitting region 130R corresponding to the R pixel region, a second light emitting region 130B corresponding to the G pixel region and the third light emitting area 130G corresponding to the B pixel region.

Alternatively, the guest material of the first light emitting region 130R corresponding to the R pixel region in the present embodiment includes the phosphorescent material, the guest material of the second light emitting region 130G corresponding to the G pixel region includes the phosphorescent material, and the guest material of the third light emitting regions 130B corresponding to the B pixel region includes a fluorescent material. The material of the first light emitting region 130R further includes a first host material which may alternatively be formed by a single or multiple host materials. Alternatively, the host material may be carbazole compounds. The material of the second light emitting region 130G further includes a second host material which may alternatively be formed by a single or multiple host materials. Alternatively, the host material may be carbazole compounds. The material of the third light emitting region 130B further includes a third host material which may alternatively be formed by a single or multiple host materials. Alternatively, the host material may be aromatic compounds. When the constituent materials of any one of the light-emitting regions include the multiple host materials, the multiple host materials may be mixed in advance and then the mixed host material may be vapor-deposited, or the multiple host materials may be directly vapor-deposited simultaneously. When the constituent materials of any one of the light emitting regions include multiple guest materials, the multiple guest materials may be mixed beforehand and then the mixed guest material may be vapor-deposited, or the multiple guest materials may be directly vapor-deposited simultaneously.

It is to be noted that when the organic light emitting display device includes pixel regions of multiple light emission colors, it is necessary to sequentially vapor-deposit the light emitting regions corresponding to the pixel regions of the different light emission colors. For example, The first light emitting area 130R, the second light emitting area 130G and the third light emitting area 130B are sequentially formed in the order of the R pixel region, the G pixel region and the B pixel region.

Figure 11C:
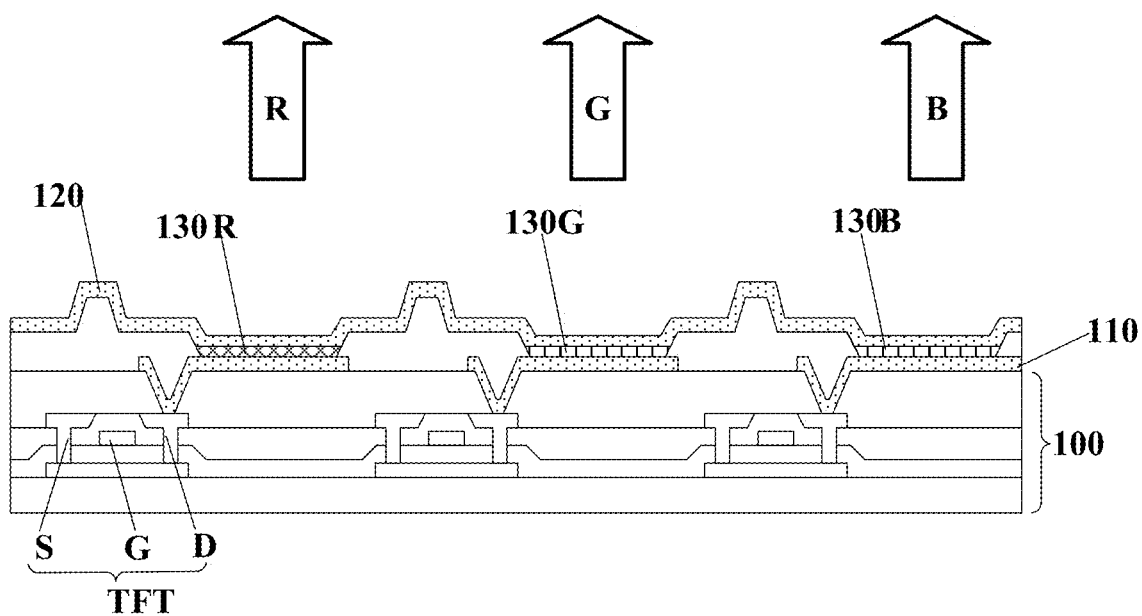

At step 230, a second electrode 120 is formed on the light emitting layer 130 as shown in FIG. 11C.

Alternatively, the material of the second electrode 130 in this embodiment includes metal or metal alloy such as a magnesium silver alloy, a silver metal, a silver ytterbium alloy or a silver rare earth metal alloy, and the second electrode 130 serves as a translucent cathode of the organic light emitting display device. It will be appreciated by those skilled in the art that the constituent materials of the second electrode include, but are not limited to, the above-described examples, and that the relevant practitioners themselves may select the material of the second electrode according to the requirements for products.

Figure 11D:
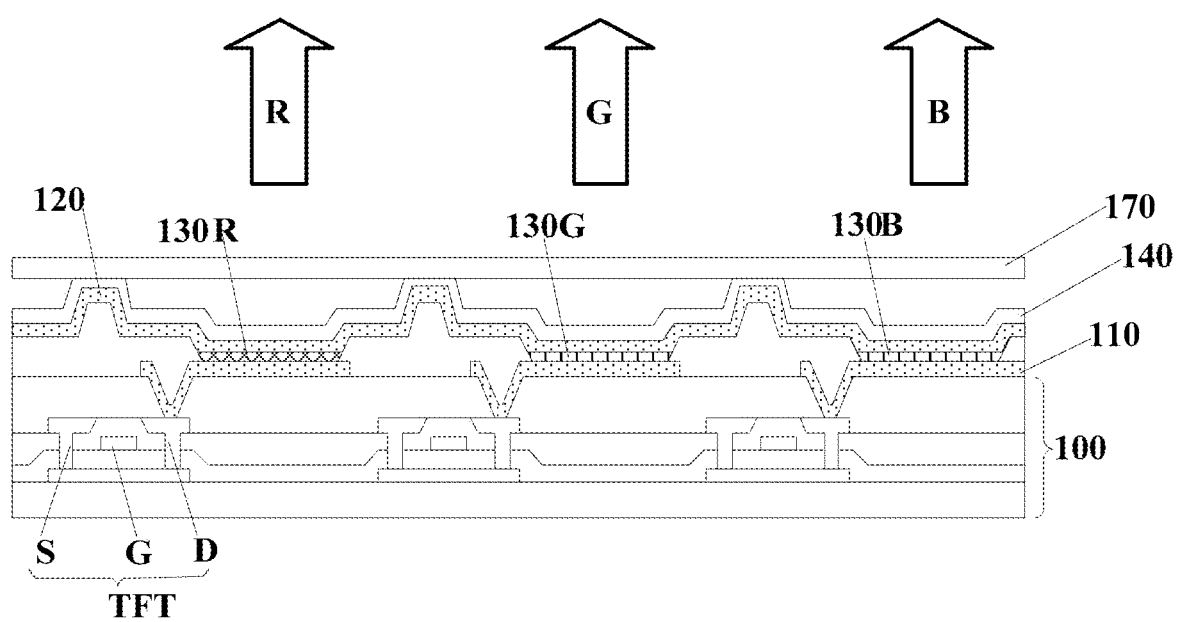

At step 240, a capping layer 140 is formed on the second electrode 120 as shown in FIG. 11D, where the capping layer 140 is formed as a single layer or multiple superposed layers. At least one layer of the capping layer 140 is a composite layer, and the material of the composite layer contains organic materials and metal dopants.

In the present embodiment, the material of the composite layer contains an organic material and metal dopants, and the metal dopant has a higher reflection and refractive performance such that the refractive index of the capping layer is not significantly reduced and the light extraction efficiency of the capping layer would not be affected. Moreover, metal dopants having good reflection and refraction properties can refract and reflect the light introduced into the capping layer, and thus the light is scattered in different directions, to thereby achieving the effect of improving the color cast of device. In addition, since the metal dopant has a higher electrical conductivity, the doping of the metal dopant into the organic material can improve the conductivity of the composite layer, and the direct contact between the composite layer and the second electrode can increase the equivalent thickness of the second electrode and therefore decrease the resistance of the second electrode, so that the composite layer can be multiplexed as an auxiliary electrode for the second electrode. When the second electrode 120 is energized, the voltage drop across the second electrode 120 is reduced due to the direct contact between the composite layer 141 as the auxiliary electrode and the second electrode 120, thereby improving the unevenness of display brightness of the device, and improving the evenness of display brightness of the organic light emission display device. Accordingly, it is unnecessary to provide a separate auxiliary electrode, but is still able to achieve the lightness of the organic light-emitting display device.

It is to be noted that the first electrode 110, the light emitting layer, the second electrode 120, and the capping layer 140 may be formed by a thermal vapor-deposition method, an electron beam deposition method, a molecular beam epitaxy method, a vapor phase epitaxy method, or a chemical vapor deposition method, or a thermal resistance wire vapor-deposition method, and a cover plate 170 on the capping layer 140 may be formed by using laser sintered glass powder packaging. The related practitioners themselves can select the process for manufacturing each film structure in the organic light emitting display device according to the process conditions such as the product, the production equipment and the like, and the present disclosure is not particularly limited. It will be understood by those skilled in the art that the organic light emitting display device may further include a structure such as an upper substrate and will not be described here.

According to the organic light emitting display device of the present embodiment, the capping layer includes at least one composite layer. The constituent materials of the composite layer include an organic material and a metal dopant. In the present embodiment, the composite layer contains an organic material, and the capping layer has a higher refractive index and an light extraction efficiency. The composite layer further contains the metal dopant, and the metal dopant itself has good reflection and refraction properties. When the metal dopant is doped into the organic material, the refractive index of the capping layer is not significantly reduced such that the light extraction efficiency of the capping layer would not be affected. In this way, the high refractive index and the light extraction efficiency of the capping layer are ensured. In the embodiments of the present disclosure, after the light emitted from the light emitting layer enters the capping layer, the metal dopant in the capping layer reflects and refracts the light such that the propagation direction of the portion of the light is changed and the light is scattered in different directions. Therefore, when the viewer observes the organic light emitting display device from various perspectives, it is possible to see the scattered light, thereby reducing the color cast phenomenon.

The embodiment also provides an organic light emitting display apparatus which includes an organic light emitting display device as described in any of the embodiments as described above. The organic light emitting display apparatus may be a top-emitting structure in which the light emitted from the light emitting layer is emitted through one side surface of the second electrode.

According to the organic light emitting display apparatus of the present embodiment, the light emitting layer may be formed of a color light emitting material. For example, a first light emitting region corresponding to an R pixel region is formed of a red light emitting material, a second light emitting region corresponding to a G pixel region is formed of a green light emitting material, and a third light emitting region corresponding to a B pixel region is formed of a blue light emitting material. In other embodiments, however, the light emitting layer is alternatively formed of a white light emitting material, and the organic light emitting display apparatus further includes a red filter film provided in correspondence with the first light emitting region, and as a result, the white light emitted from the first light emitting region passes through the red filter film to form red lights; a green filter film provided in correspondence with the second light emitting region, and as a result, the white light emitted from the second light emitting region passes through the green filter film to form green lights; and a blue filter film provided in correspondence with the third light emitting region, and as a result, the white light emitted from the third light emitting region passes through the green filter film to form blue lights.

The organic light emitting display apparatus provided in the present embodiment can be applied to a wearable smart bracelet or a display field such as a smart phone, a tablet computer and the like.

It is noted that the foregoing is only an embodiment and the technical principles used. It will be understood by those skilled in the art that the present disclosure is not limited to the specific embodiments described herein, and that various changes, remodifications and substitutions will be apparent to those skilled in the art without departing from the scope of the disclosure. Thus, while the present disclosure has been described in more detail by way of the above embodiments, the present disclosure is not limited to the above embodiments, but may include more equivalent embodiments without departing from the concept of the present disclosure, and the scope of the present disclosure is to be determined by the scope of the appended claims.

What is claimed is:

1. An organic light emitting display device, comprising:
   a first electrode and a second electrode disposed opposite to each other,
   a light emitting layer positioned between the first electrode and the second electrode, and
   a capping layer positioned on a surface of a side of the second electrode facing away from the light emitting layer, wherein
   the capping layer is formed as a single layer or superposition of a plurality of layers, at least one layer of the capping layer is a composite layer, and a material of the composite layer comprises an organic material and a metal dopant;
   the composite layer is in direct contact with the second electrode; and the composite layer is multiplexed as an auxiliary electrode for the second electrode,
   wherein the material of the metal dopant contains Yb,
   wherein a mass ratio of the metal dopant in the composite layer is greater than or equal to 20% and less than or equal to 50%.

2. The organic light emitting display device according to claim 1, wherein the capping layer comprises the plurality of layers in a superposed structure, at least two of the layers are composite layers, at least two of the composite layers conform to at least one of the following conditions:
organic materials of at least two of the composite layers are different;
metal dopants of at least two of the composite layers are different; and
mass ratios of organic materials of at least two of the composite layers are different.

3. The organic light emitting display device according to claim 1, wherein the capping layer comprises the plurality of layers in a superposed structure, at least one of the layers is a barrier layer, and a material of the barrier layer comprises any one of an inorganic material, an organic material, a mixed material of the inorganic material and the organic material, a mixed material of the inorganic material and a metal dopant, and a mixed material of the inorganic material, the organic material and the metal dopant.

4. The organic light emitting display device according to claim 3, wherein a thickness of the composite layer is 30 nm and a thickness of the barrier layer is 40 nm.

5. The organic light emitting display device according to claim 1, wherein a thickness of the capping layer is greater than or equal to 50 nm and less than or equal to 90 nm.

6. The organic light emitting display device according to claim 1, wherein the light emitting layer comprises a plurality of light emitting regions, the plurality of light emitting regions correspond to a plurality of pixel regions respectively, the plurality of pixel regions comprise m kinds of light emission colors, wherein m is an integer greater than or equal to 1; and
the capping layer comprises a plurality of cap areas, and the plurality of cap areas are provided in correspondence with the plurality of pixel regions, and thicknesses of the cap areas corresponding to pixel regions of any two kinds of light emission colors are different.

7. The organic light emitting display device according to claim 1, wherein the material of the second electrode comprises a metal material or a metal alloy material, and the material of the first electrode comprises ITO or IZO.

8. The organic light emitting display device according to claim 1, further comprising a first functional layer located between the light emitting layer and the second electrode, the first functional layer comprises at least an electron transport layer.

9. The organic light emitting display device according to claim 8, wherein a host material of the electron transport layer comprises an aromatic compound; and the electron transport layer is formed as a single layer or superposition of a plurality of layers, at least one layer is a first electron transport layer, and the material of said first electron transport layer comprises a guest dopant which is a metal or a metal compound.

10. The organic light emitting display device according to claim 9, wherein the host material of said first electron transport layer comprises an aromatic compound, and the guest dopant of the first electron transport layer contains any one of an alkali metal, an alkaline earth metal, a rare earth metal, an alkali metal compound, an alkaline earth metal compound and an rare earth metal compound.

11. The organic light emitting display device according to claim 1, further comprising a second functional layer located between the first electrode and the light emitting layer, and the second functional layer comprises at least a hole transport layer.

12. The organic light emitting display device according to claim 1, further comprising a first substrate located on a surface of a side of the first electrode facing away from the light emitting layer, the first substrate being a rigid substrate or a flexible substrate.

13. An organic light emitting display apparatus, comprising:
an organic light emitting display device comprising:
a first electrode and a second electrode disposed opposite to each other,
a light emitting layer positioned between the first electrode and the second electrode, and
a capping layer positioned on a surface of a side of the second electrode facing away from the light emitting layer, wherein
the capping layer is formed as a single layer or superposition of a plurality of layers, at least one layer of the capping layer is a composite layer, and a material of the composite layer comprises an organic material and a metal dopant;
the composite layer is in direct contact with the second electrode; and the composite layer is multiplexed as an auxiliary electrode for the second electrode,
wherein the material of the metal dopant contains Yb,
wherein a mass ratio of the metal dopant in the composite layer is greater than or equal to 20% and less than or equal to 50%.

* * * * *